(12) United States Patent
Kim

(10) Patent No.: US 7,572,658 B2
(45) Date of Patent: Aug. 11, 2009

(54) METHOD OF MANUFACTURING DISPLAY PANEL FOR FLEXIBLE DISPLAY DEVICE

(75) Inventor: Sung-Jin Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/526,174

(22) Filed: Sep. 21, 2006

(65) Prior Publication Data

US 2007/0072323 A1    Mar. 29, 2007

(30) Foreign Application Priority Data

Sep. 23, 2005   (KR) .................... 10-2005-0088798

(51) Int. Cl.
*H01L 27/146* (2006.01)

(52) U.S. Cl. ............... 438/34; 438/35; 204/192.14; 204/192.17; 204/192.22; 257/E21.169

(58) Field of Classification Search .......... 438/34, 438/35; 204/192.14, 192.17, 192.22; 257/E21.169
See application file for complete search history.

(56) References Cited

U.S. PATENT DOCUMENTS

| | | | | |
|---|---|---|---|---|
| 5,417,770 | A * | 5/1995 | Saitoh et al. ............... | 136/258 |
| 6,274,412 | B1 * | 8/2001 | Kydd et al. ................. | 438/149 |
| 6,680,242 | B2 * | 1/2004 | Ohtsu et al. ................. | 438/487 |
| 6,720,119 | B2 * | 4/2004 | Ohtsu et al. ..................... | 430/7 |
| 2002/0132454 | A1 * | 9/2002 | Ohtsu et al. ................. | 438/486 |
| 2002/0195928 | A1 * | 12/2002 | Grace et al. .................. | 313/503 |
| 2003/0032210 | A1 * | 2/2003 | Takayama et al. ............. | 438/30 |
| 2003/0047280 | A1 * | 3/2003 | Takayama et al. ........... | 156/344 |
| 2003/0214691 | A1 * | 11/2003 | Magno et al. ................ | 359/196 |
| 2004/0119916 | A1 * | 6/2004 | Kim et al. .................... | 349/110 |
| 2004/0127038 | A1 * | 7/2004 | Carcia et al. ................ | 438/689 |
| 2005/0099615 | A1 * | 5/2005 | Ishii ............................. | 355/67 |
| 2006/0003479 | A1 * | 1/2006 | Park et al. ..................... | 438/30 |
| 2006/0197092 | A1 * | 9/2006 | Hoffman et al. ............... | 257/72 |
| 2006/0286725 | A1 * | 12/2006 | Cheng et al. ................. | 438/151 |
| 2006/0286737 | A1 * | 12/2006 | Levy et al. ................... | 438/199 |

FOREIGN PATENT DOCUMENTS

| | | |
|---|---|---|
| JP | 07-056131 A | 3/1995 |
| JP | 8-124850 | 5/1996 |

(Continued)

OTHER PUBLICATIONS

Patent Abstracts of Japan, Publication No. 08-124850, May 17, 1998, 1 p.

(Continued)

*Primary Examiner*—George Fourson
(74) *Attorney, Agent, or Firm*—Haynes & Boone, LLP

(57) ABSTRACT

A liquid crystal display panel manufacturing method includes forming at least one thin film on a flexible plastic substrate by sputtering at a temperature of about 80° C. to about 150° C. Sputtering can be in a chamber evacuated to about $1 \times 10^{-6}$ Torr to about $9 \times 10^{-6}$ Torr. Sputtering targets and films sputtered on substrates include materials that are conductive or insulating, organic or inorganic, metal or metal alloy, reflective metal or transparent conductive, or combinations thereof. Thin film and pattern formation employ photolithography with laminated or liquid films. Films may be sputtered on opposing sides of a substrate and may be multilayered.

16 Claims, 29 Drawing Sheets

FOREIGN PATENT DOCUMENTS

| | | |
|---|---|---|
| JP | 9-195035 | 7/1997 |
| JP | 2000-129436 | 5/2000 |
| JP | 2000-144374 | 5/2000 |
| JP | 2003-119562 | 4/2003 |
| KR | 1998-083821 | 12/1998 |
| KR | 2001-0028341 | 4/2001 |
| KR | 10-0376960 | 10/2002 |
| KR | 2003-0037240 | 5/2003 |
| KR | 2004-0078906 | 9/2004 |
| KR | 2004-0085810 | 10/2004 |
| KR | 2005-0019607 | 3/2005 |
| KR | 2005-0052830 | 6/2005 |

OTHER PUBLICATIONS

Patent Abstracts of Japan, Publication No. 09-195035, Jul. 29, 1997, 1 p.
Patent Abstracts of Japan, Publication No. 2000-129436, May 9, 2000, 1 p.
Patent Abstracts of Japan, Publication No. 2000-144374, May 26, 2000, 1 p.
Patent Abstracts of Japan, Publication No. 2003-119562, Apr. 23, 2003, 1 p.
Korean Patent Abstracts, Publication No. 1998-083821, Dec. 5, 1998, 1 p.
Korean Patent Abstracts, Publication No. 1020010028341, Apr. 6, 2001, 1 p.
Korean Patent Abstracts, Publication No. 10-0376960, Oct. 5, 2002, 1 p.
Korean Patent Abstracts, Publication No. 1020030037240, May 12, 2003, 1 p.
Korean Patent Abstracts, Publication No. 1020040078906, Sep. 13, 2004, 1 p.
Korean Patent Abstracts, Publication No. 1020040085810, Oct. 9, 2004, 1 p.
Korean Patent Abstracts, Publication No. 1020050019607, Mar. 3, 2005, 1 p.
Korean Patent Abstracts, Publication No. 1020050052830, Jun. 7, 2005, 1 p.

* cited by examiner

METHOD OF MANUFACTURING DISPLAY PANEL FOR FLEXIBLE DISPLAY DEVICE

CROSS-REFERENCE TO RELATED APPLICATION

This application claims priority to and the benefit of Korean Patent Application No. 10-2005-0088798 filed in the Korean Intellectual Property Office on Sep. 23, 2005, the entire contents of which are incorporated herein by reference.

BACKGROUND OF THE INVENTION (a) Field of the Invention

The present invention relates to a manufacturing method of a flexible display device. More particularly, the present invention relates to a manufacturing method of a display panel for a flexible display device including a plastic substrate.

(b) Description of the Related Art

A liquid crystal display and an organic light emitting diode (OLED) display are representative of flat panel displays that are used widely at present.

The liquid crystal display generally includes an upper panel in which elements such as a common electrode and color filters are formed; a lower panel in which thin film transistors and pixel electrodes are formed; and a liquid crystal layer that is interposed between the two display panels. If a potential difference between a pixel electrode and the common electrode is generated, an electric field is generated in the liquid crystal layer. This electric field determines an orientation, or arrangement direction, of liquid crystal molecules in the liquid crystal layer, with the transmittance of incidence light being determined by the arrangement direction of the liquid crystal molecules. Accordingly, a desired image can be displayed by adjusting the potential difference between the two electrodes.

An OLED display includes a hole injection electrode (anode), an electron injection electrode (cathode), and an organic emission layer formed therebetween. An OLED display is a self-emissive display that emits light in an organic emission layer, through recombination of holes injected from the anode and electrons injected from the cathode.

Such display devices have limited portability and screen size, because they typically use a heavy, fragile glass substrate. Therefore, a display device using a lightweight, impact resistant, and flexible plastic substrate has been developed. However, when a high temperature is applied to such plastic, the plastic has a property of bending or expanding. Accordingly, it is difficult to form a thin film pattern such as an electrode or a signal line on the plastic, and it is desirable to provide a method of manufacturing a display panel using lower temperatures.

SUMMARY OF THE INVENTION

An exemplary embodiment of the present invention provides a method of manufacturing a display panel for a liquid crystal display, including mounting a flexible substrate in a sputtering chamber, and depositing a thin film by sputtering a target on the substrate, wherein the sputtering is performed at a temperature of between about 80° C. to about 150° C.

According to an embodiment of the present invention, the method may further include laminating a photosensitive film on the thin film and patterning the photosensitive film with a photolithography process.

The sputtering may be performed in a sputtering chamber evacuated to between about $1 \times 10^{-6}$ Torr to about $9 \times 10^{-6}$ Torr of vacuum. The target may be disposed on both sides of the substrate, and the thin film may be simultaneously formed on both sides of the substrate.

Another embodiment of the present invention provides a method of manufacturing a display panel for a liquid crystal display, including: preparing a flexible substrate; forming a gate line on the substrate; depositing a gate insulating layer on the substrate; forming a semiconductor layer on the gate insulating layer; forming a data line and a drain electrode on the semiconductor layer; and forming a pixel electrode that is electrically connected to the drain electrode. At least one of the forming of a gate line, the depositing of a gate insulating layer, the forming of a semiconductor layer, the forming of a drain electrode and a data line including a source electrode, and the forming of a pixel electrode includes sputtering at a temperature of between about 80° C. to about 150° C.

According to an embodiment of the present invention, the preparing a flexible substrate may include mounting the substrate in a sputtering chamber, and depositing a protection layer on both surfaces of the substrate with a sputtering process, wherein the protection layer may be simultaneously sputtered from two targets that are disposed on both surfaces of the substrate. The sputtering may be performed in a sputtering chamber evacuated to between about $1 \times 10^{-6}$ Torr to about $9 \times 10^{-6}$ Torr of vacuum.

At least one of the forming of a gate line, the forming of a semiconductor layer, the forming of a drain electrode and a data line including a source electrode, and the forming of a pixel electrode may include laminating a photosensitive film on a target layer that is deposited with a sputtering process, and patterning the photosensitive film with photolithography.

Yet another embodiment of the present invention provides a method of manufacturing a display panel for a liquid crystal display, including: preparing a flexible substrate; forming a gate line on the substrate; depositing a gate insulating layer on the substrate; depositing a semiconductor layer and an ohmic contact layer on the gate insulating layer; depositing a conductive layer on the ohmic contact layer; forming a first photosensitive film pattern on the conductive layer; etching the conductive layer, the ohmic contact layer, and the semiconductor layer using a first photosensitive film pattern as an etching mask; forming a second sensitive film pattern by removing the first sensitive film pattern to a predetermined thickness; etching the conductive layer and exposing a part of the ohmic contact layer using the second photosensitive film pattern as an etching mask; and forming a pixel electrode on the conductive layer. At least one of the forming of the gate line, the depositing of the gate insulating layer, the depositing of the semiconductor layer and the ohmic contact layer, the depositing of the conductive layer, and the forming of the pixel electrode includes sputtering at a temperature of between about 80° C. to about 150° C. The sputtering may be performed in a sputtering chamber evacuated to between about $1 \times 10^{-6}$ Torr to about $9 \times 10^{-6}$ Torr of vacuum.

According to an embodiment of the present invention, the preparing of a flexible substrate may include mounting the substrate in a sputtering chamber, and depositing a protection layer on both surfaces of the substrate with a sputtering process, wherein the protection layer may be simultaneously sputtered from two targets that are disposed on both sides of the substrate.

DETAILED DESCRIPTION OF THE EMBODIMENTS

Figure 1:
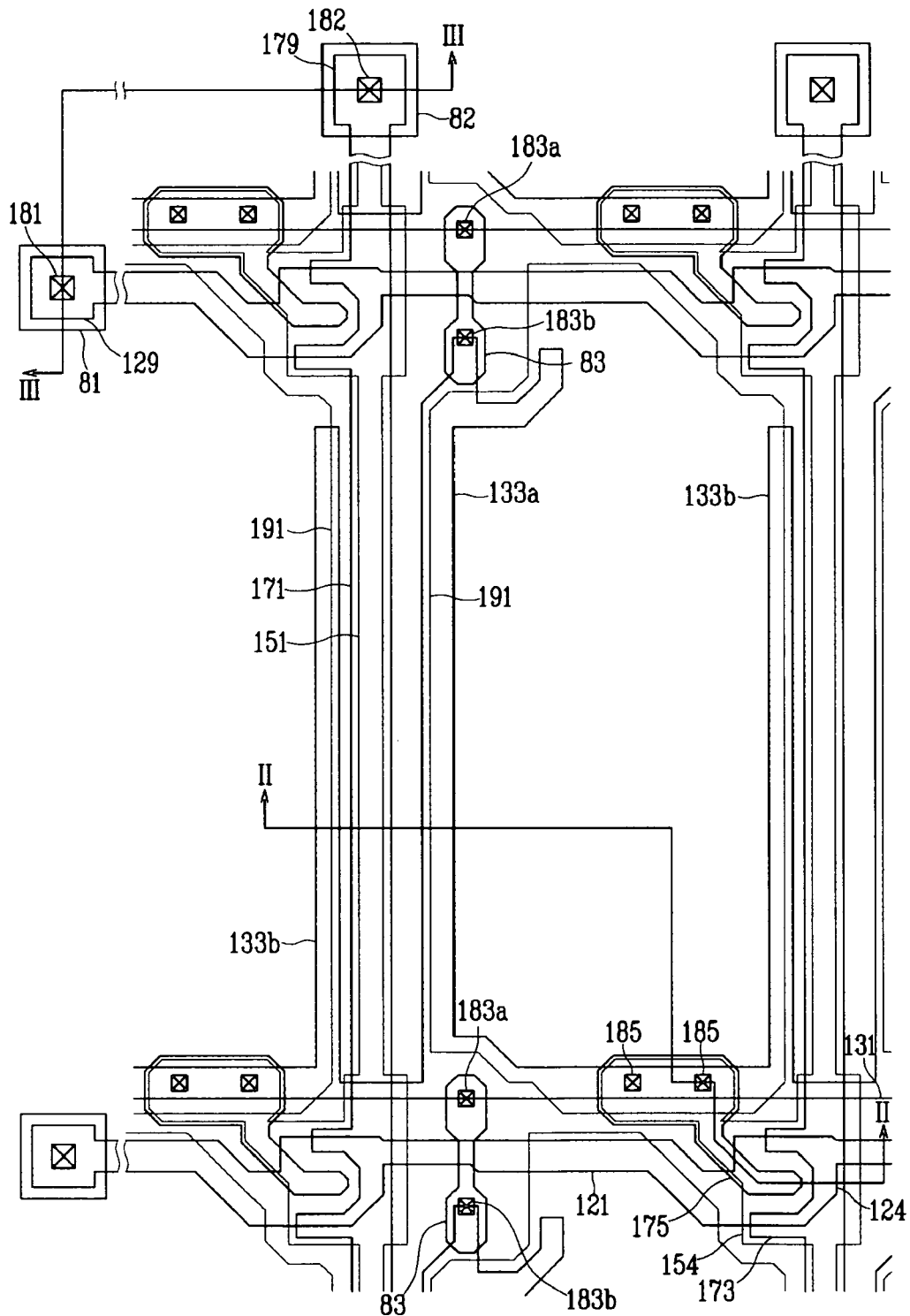
FIG. 1 is a layout view of a thin film transistor array panel for a liquid crystal display according to an exemplary embodiment of the present invention.

Embodiments of the present invention provide a method of manufacturing a flexible display device having advantages of forming an accurate thin film pattern on a plastic substrate, while avoiding heat deformation of the plastic substrate while the thin film is being thus formed.

Now, embodiments of the present invention will be described more fully hereinafter, with reference to the accompanying drawings, in which preferred embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Throughout the specification, like reference numerals designate like elements. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
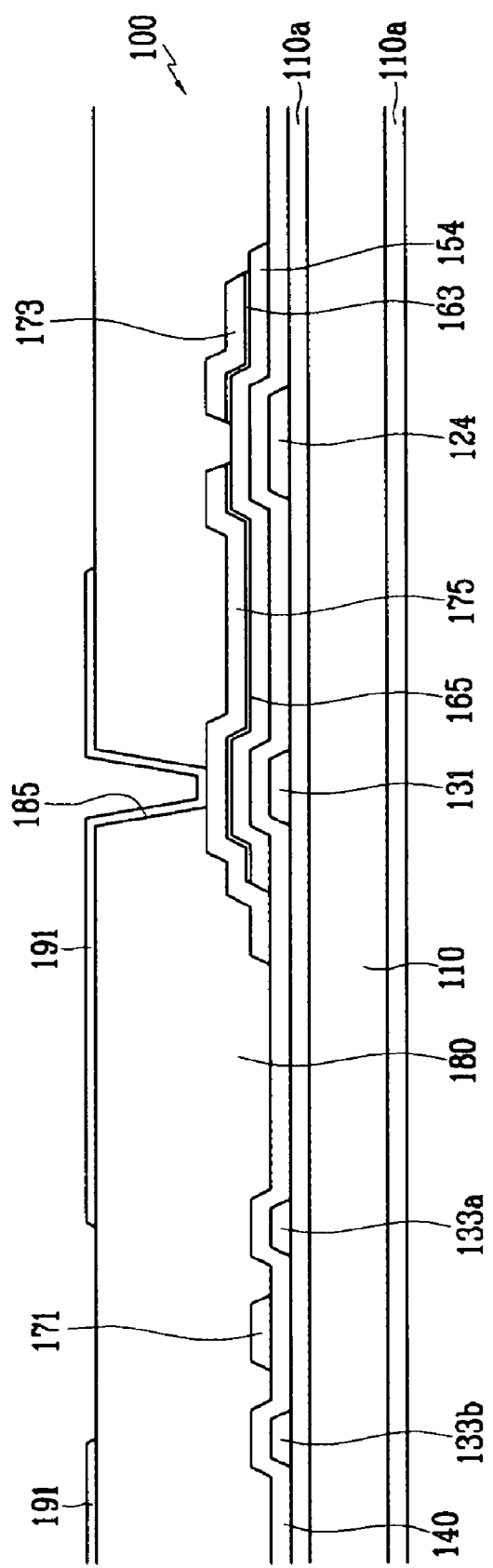
FIGS. 2 and 3 are cross-sectional views of the thin film transistor array panel taken along lines II-II and III-III of FIG. 1.
Figure 3:
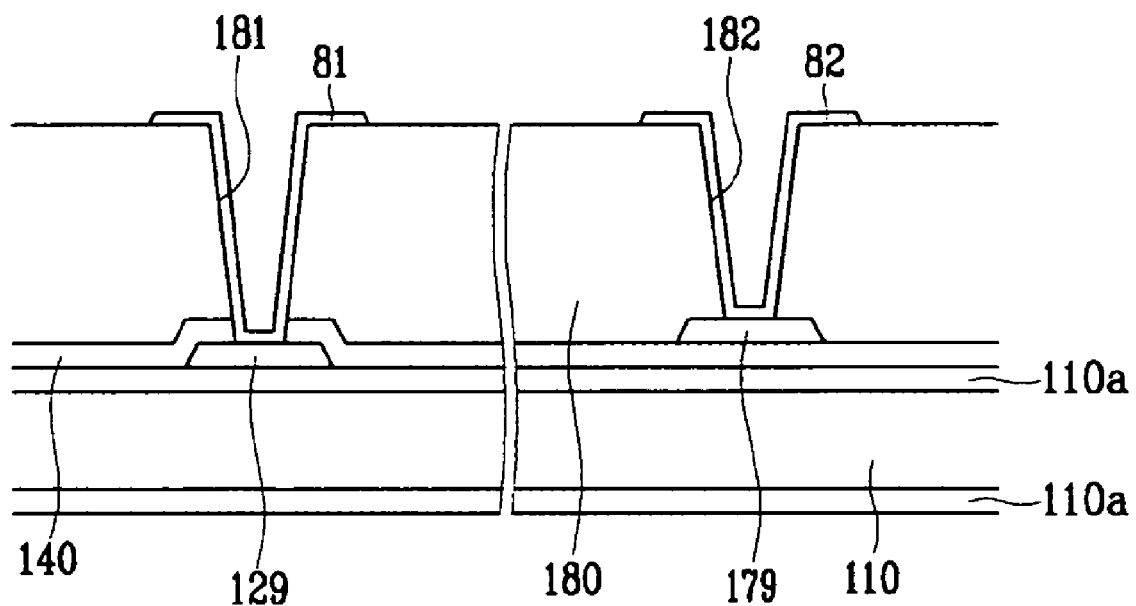

First, referring to FIGS. 1 to 3, a thin film transistor array panel according to an exemplary embodiment of the present invention will be described in detail. FIG. 1 is a layout view of a thin film transistor array panel for a liquid crystal display, according to an exemplary embodiment of the present invention. FIGS. 2 and 3 are cross-sectional views of the thin film transistor array panel taken along lines II-II and III-III of FIG. 1.

A plurality of gate lines 121 and a plurality of storage electrode lines 131 are formed on a flexible substrate 110 such as a plastic substrate. The gate line 121 transfers a gate signal and is mainly extended in a horizontal direction. Each gate line 121 includes a wide end part 129 for connecting a plurality of gate electrodes 124 that is protruded downwardly to other layers or to an external driving circuit.

A gate driving circuit (not shown) for generating a gate signal may be mounted on a flexible printed circuit film (not shown) that is attached to the substrate 110, may be directly mounted to the substrate 110, or may be integrated into the substrate 110. When the gate driving circuit is integrated into the substrate 110, the gate line 121 is extended to directly connect thereto.

Each storage electrode line 131 includes a branch line that receives a predetermined voltage and is extended substantially in parallel to the gate line 121, with a plurality of electrode pairs, such as, for example, first and second storage electrodes 133a and 133b, which are divided from one another. Each of the storage electrode lines 131 is positioned between two adjacent gate lines 121, and the branch line is nearly positioned in a lower line of the two gate lines 121. Each of the storage electrodes 133a and 133b has a fixed end that is connected to the branch line and a free end in the opposite side thereof. The fixed end of the first storage electrode 133a has a wide area, and a free end thereof is divided into two parts: a straight electrode part and a bending electrode part. However, the shape and disposition of the storage electrode lines 131 may be varied.

The gate lines 121 and the storage electrode lines 131 may be made of a layer of an exemplary conductive material, including without limitation, aluminum metals, such as aluminum (Al) or an aluminum alloy; silver metals, such as silver (Ag) or a silver alloy; copper metals, such as copper (Cu) or a copper alloy; molybdenum metals, such as molybdenum (Mo) or a molybdenum alloy; or a metal such as chromium (Cr), thallium (Ta), or titanium (Ti). However, each gate line 121 and storage electrode line 131 may have a multilayer structure including at least two conductive layers (not shown) that have different physical properties. For example, in order to reduce a signal delay or a voltage drop, one exemplary conductive layer of the multilayer structure made be formed from metals having low resistivity, including without limitation, aluminum metals, silver metals, or copper metals. In addition, it may be desirable to form another exemplary conductive layer of conductive materials having excellent physical, chemical, and electrical contact characteristics with other materials, specifically ITO (indium tin oxide) and IZO (indium zinc oxide, including without limitation, molybdenum metals, or metals such as chromium (Cr), thallium (Ta), or titanium (Ti). One exemplary multilayer conductor may include a chromium lower layer and an aluminum (or Al alloy) upper layer; and another exemplary multilayer conductor may include an aluminum (or Al alloy) lower layer and a molybdenum (or Mo alloy) upper layer. However, the gate lines 121 and the storage electrode lines 131 may be made of other conductive materials, including metals.

Side surfaces of the gate lines 121 and the storage electrode lines 131 are inclined to a surface of the substrate 110, and an inclination angle thereof is desirably between about 30° to about 80°.

An insulating layer 140 is formed on the gate lines 121 and the storage electrode lines 131. Suitable materials for layer 140 include without limitation silicon nitride (SiNx) and silicon oxide (SiOx). A plurality of semiconductor stripes 151 are formed on the gate insulating layer 140. Each semiconductor stripe 151 is extended substantially in a vertical direction, and includes a plurality of projections 154 that are extended toward a gate electrode 124. A portion of each semiconductor stripe 151 includes an expanded portion that covers a portion of gate line 121 and a portion of storage electrode line 131. Desirably, semiconductor stripes 151 are made of a suitable material such as hydrogenated amorphous silicon (abbreviated to a—Si), polysilicon.

A plurality of ohmic contact stripes and islands 161 and 165 are formed on the semiconductor stripe 151. The ohmic contacts 161 and 165 may be made of a material such as a silicide, or an n+ hydrogenated amorphous silicon in which an n-type impurity such as phosphorus is doped with a high concentration. The ohmic contact stripe 161 has a plurality of projections 163, and a projection 163 and an ohmic contact island 165 are formed in pairs and disposed on the projection 154 of the semiconductor 151.

Side surfaces of the semiconductor 151 and the ohmic contacts 161 and 165 are also inclined to the surface of the substrate 110, and an inclination angle thereof is between about 30° to about 80°.

A plurality of data lines 171 and a plurality of drain electrodes 175 are formed on the ohmic contacts 161 and 165 and the gate insulating layer 140. Each data line 171 transfers a data signal and is extended substantially in a vertical direction to intersect a gate line 121. Each data line 171 also intersects a storage electrode line 131, and is disposed between adjacent storage electrodes 133*a* and 133*b*. Each data line 171 includes a wide end part 179 for connecting to a plurality of source electrodes 173 that are extended toward the gate electrode 124. Also, data line 171 can be bent into a 'J' shape to connect with other layers or with an external driving circuit. A data driving circuit (not shown) for generating data signals may be mounted on a flexible printed circuit film (not shown) that is attached to the substrate 110, may be directly mounted to the substrate 110, or may be integrated into the substrate 110. When the data driving circuit is integrated into the substrate 110, the data lines 171 are extended to directly connect thereto.

Each source electrode 173 and drain electrode 175 are spaced apart and formed on gate electrode 124, with drain electrode 175 facing source electrode 173 and being separated from the data line 171. Each exemplary source electrode may include a U-shaped portion. Each exemplary drain electrode 175 may include one wide end portion and one bar-shaped end portion. The wide end portion is overlapped with the storage electrode line 131, and a part of the bar-shaped end portion is interdigitated with the 'U'-shaped portion of source electrode 173.

A gate electrode 124, a source electrode 173, and a drain electrode 175 along with a projection 154 of the semiconductor 151, form a thin film transistor (TFT), with the channel of the TFT being formed in the projection 154 between the source electrode 173 and the drain electrode 175.

It is preferable that the data lines 171 and the drain electrodes 175 are made of a refractory metal including without limitation molybdenum, chromium, tantalum, or titanium, or a refractory metal alloy. In addition, the data lines 171 and the drain electrodes 175 can have a multilayer structure including a refractory metal layer (not shown) and a low resistance conductive layer (not shown). Multilayer structures can also include two or more layers of conductive materials. An exemplary dual-layer structure can include, without limitation, an upper layer made of aluminum or an aluminum alloy, and a lower layer made of chromium, a chromium alloy, molybdenum, or a molybdenum alloy. An exemplary tri-layer structure may include, without limitation, an upper layer and a lower layer made of molybdenum or a molybdenum alloy; and a middle layer made of aluminum or an aluminum alloy. However, the data lines 171 and the drain electrodes 175 also may be made of other suitable conductive materials, including refractory metals and their alloys.

It is preferable that side surfaces of the data lines 171 and the drain electrodes 175 also are inclined relative to the surface of the substrate 110, with a desirable inclination angle thereof being between about 30° to about 80°.

In order to reduce contact resistance, the ohmic contacts 161 and 165 are interposed between the underlying semiconductor stripes 151 and the overlying data lines 171 and the drain electrodes 175, respectively. Although the semiconductor stripes 151 may be narrower than the data lines 171 at most places, the width of the semiconductor stripes 151 becomes large near the gate lines 121 as described above, in order to smooth the profile of the surface, thereby minimizing the disconnection of the data lines 171. The semiconductor stripes 151 can also include some exposed portions not covered with the data line 171 and the drain electrode 175, such as the portions located between the source electrode 173 and the drain electrode 175.

A passivation layer 180 is formed on the data lines 171, the drain electrodes 175, and the exposed portion of the semiconductor stripes 151. The passivation layer 180 is made of an insulator, which may be an inorganic insulator, or an organic insulator, and may have a flat surface.

Suitable exemplary inorganic insulators include, without limitation, silicon nitride and silicon oxide. When an organic insulator is used, it is desirable that the organic insulator be photosensitive, and exhibit a dielectric constant of about 4.0 or less. The passivation layer 180 may be a multilayered film structure that includes at least one film of each of an inorganic insulator and an organic insulator. For example, it may be advantageous to include a lower film of inorganic insulator that minimizes potential damage by the organic insulator to the exposed portions of the semiconductor stripes 151, and an upper film of organic insulator that imparts the excellent insulating characteristics of the organic insulator to the resultant multilayered film structure of passivation layer 180.

A plurality of contact holes 182 and 185 for exposing each of the end parts 179 of the data lines 171 and the drain electrodes 175 are formed in the passivation layer 180. In the passivation layer 180 and the gate insulating layer 140 are formed a plurality of contact holes 181 for exposing the end parts 129 of the gate lines 121; a plurality of contact holes 183*a* for exposing parts of the storage electrode lines 131 around fixed ends of the first storage electrodes 133*a*; and a plurality of contact holes 183*b* for exposing protrusions of free ends of the first storage electrodes 133*a*.

On the passivation layer 180, a plurality of pixel electrodes 191, a plurality of overpasses 83, and a plurality of contact assistants 81 and 82 are formed. Depending upon the type of display being manufactured, pixel electrodes 191, overpasses 83, and contact assistants 81 and 82, may be made of a transparent conductive material such as ITO or IZO, or of a reflective metal such as aluminum, silver, or chromium, or an alloy of aluminum, of silver, or of chromium.

The pixel electrodes 191 are physically and electrically connected to the drain electrodes 175 through the contact holes 185 such that the pixel electrodes 191 receive data voltages from the drain electrodes 175. The pixel electrodes 191 which are supplied with the data voltages work in cooperation with a common electrode (not shown) of an opposing display panel (not shown) which are supplied with a common voltage, to generate electric fields that determine an orientation of liquid crystal molecules (not shown) of a liquid crystal layer (not shown) disposed therebetween. It is the determined orientation of the liquid crystal molecules that changes the polarization of light passing through the liquid crystal layer. A capacitor that stores applied voltages after the TFT is turned off and that is referred to as a "liquid crystal capacitor" is formed by pixel electrode 191 and the common electrode.

The pixel electrodes 191 and the drain electrodes 175 that are connected thereto are overlapped with the storage electrodes 133a and 133b and the storage electrode lines 131. The storage electrode line 131 form an additional capacitor, referred to as a "storage capacitor," with pixel electrode 191 and a drain electrode 175 electrically connected thereto. The "storage capacitor" generally enhances the voltage storing capacity of the liquid crystal capacitor.

The contact assistant 81 is connected to an end part 129 of the gate line 121 through the contact hole 181; and the contact assistant 82 is connected to an end part 179 of the data line 171 through contact hole 182. The contact assistants 81 and 82 may supplement adhesion between an external apparatus and, respectively, the end part 129 of the gate line 121, and the end part 179 of the data line 171. In addition, contact assistants 81 and 82 may protect respective end parts 129 and 179.

An exposed part of the storage electrode lines 131 and an exposed end part of a free end of the storage electrodes 133b are positioned at opposite sides of the gate lines 121. Overpasses 83 intersect gate lines 121 and are disposed with contact hole 183a to the exposed part of lines 131 and contact hole 183b to the exposed part of electrodes 133b, such that the exposed part of electrode line 131 and the exposed end part of electrode 133b become interconnected thereby. The storage electrodes 133a and 133b, the storage electrode lines 131, and the overpasses 83 can be used to repair a defect of the gate lines 121, of the data lines 171, or of the TFTs.

Hereinafter, a method of manufacturing the thin film transistor array panel according to an exemplary embodiment shown in FIGS. 1 to 3 will be described in detail with reference to FIGS. 4 to 18.

FIGS. 4, 8, 11, and 14 are layout views sequentially illustrating a method of manufacturing a thin film transistor array panel according to an exemplary embodiment of the present invention. FIGS. 5 and 6 are cross-sectional views of the thin film transistor array panel taken along lines V-V and VI-VI of FIG. 4. FIGS. 9 and 10 are cross-sectional views of the thin film transistor array panel taken along lines IX-IX and X-X of FIG. 8. FIGS. 12 and 13 are cross-sectional views of the thin film transistor array panel taken along lines XII-XII and XIII-XIII of FIG. 11. FIGS. 15 and 16 are cross-sectional views of the thin film transistor array panel taken along lines XV-XV and XVI-XVI of FIG. 14. FIGS. 7A to 7F show a method of forming a thin film pattern according to an exemplary embodiment of the present invention.

Figure 4:
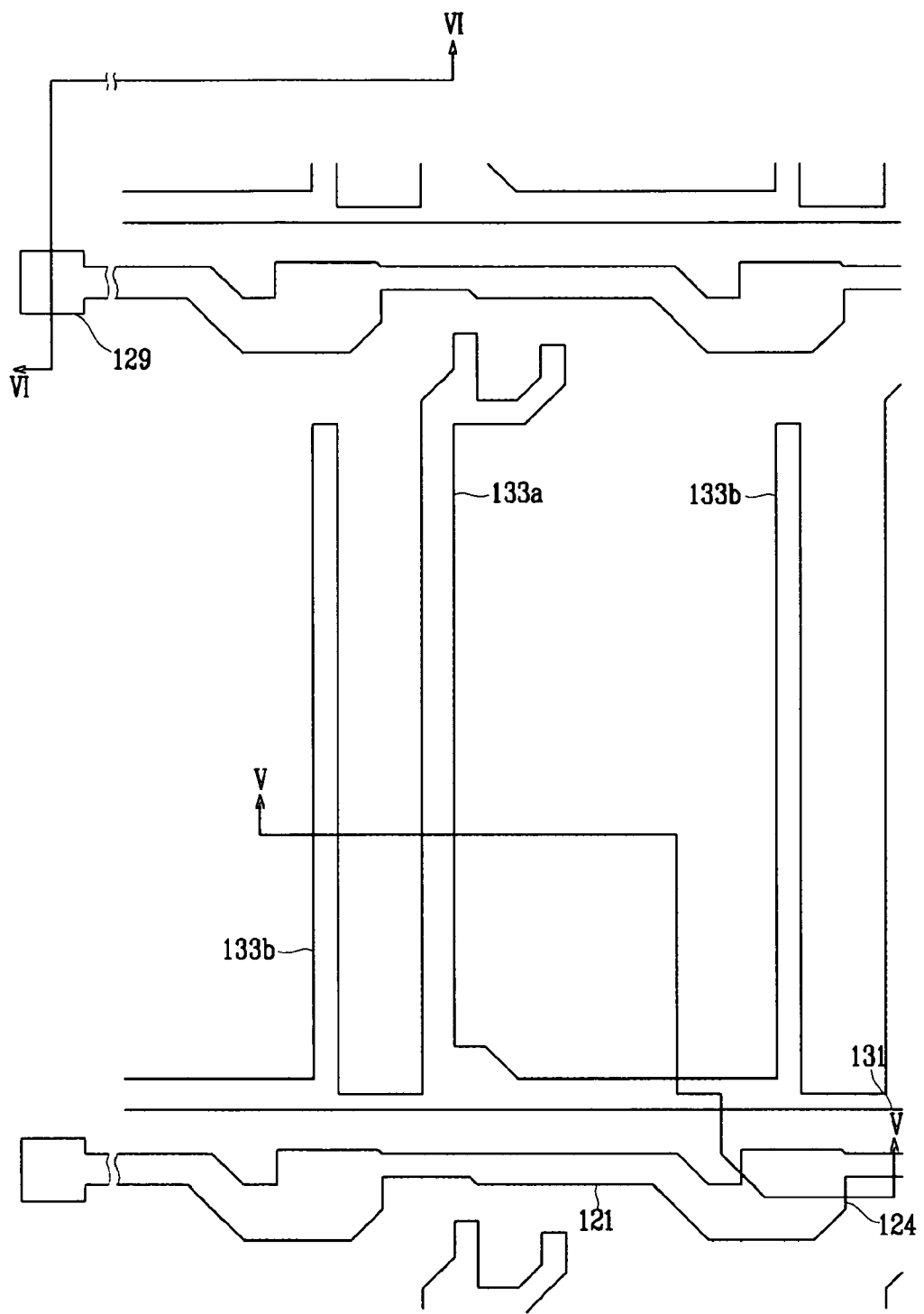
FIG. 4 is a layout view illustrating a method of manufacturing a display panel according to an exemplary embodiment of the present invention.
Figure 5:
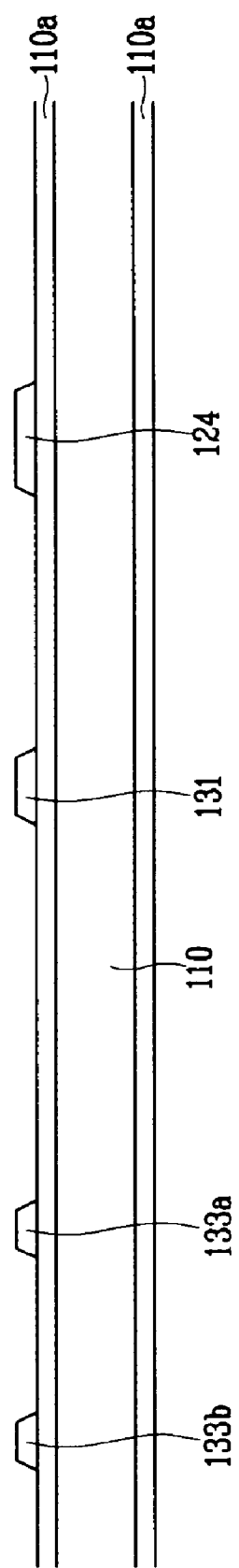
FIGS. 5 and 6 are cross-sectional views of the thin film transistor array panel taken along lines V-V and VI-VI of FIG. 4.
Figure 6:
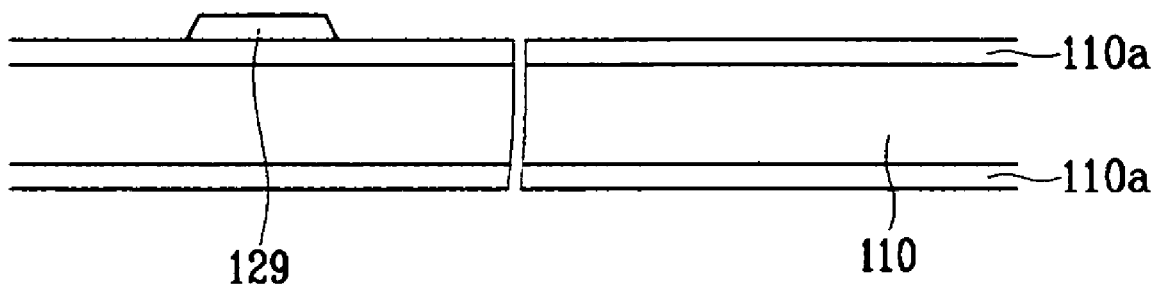

Referring to FIGS. 4 to 6, a gate line 121 and a storage electrode line 131 are formed on the flexible substrate 110. Gate line 121 can include a gate electrode 124 and an end part 129; and storage electrode line 131 can include storage electrodes 133a and 133b.

Figure 7A:
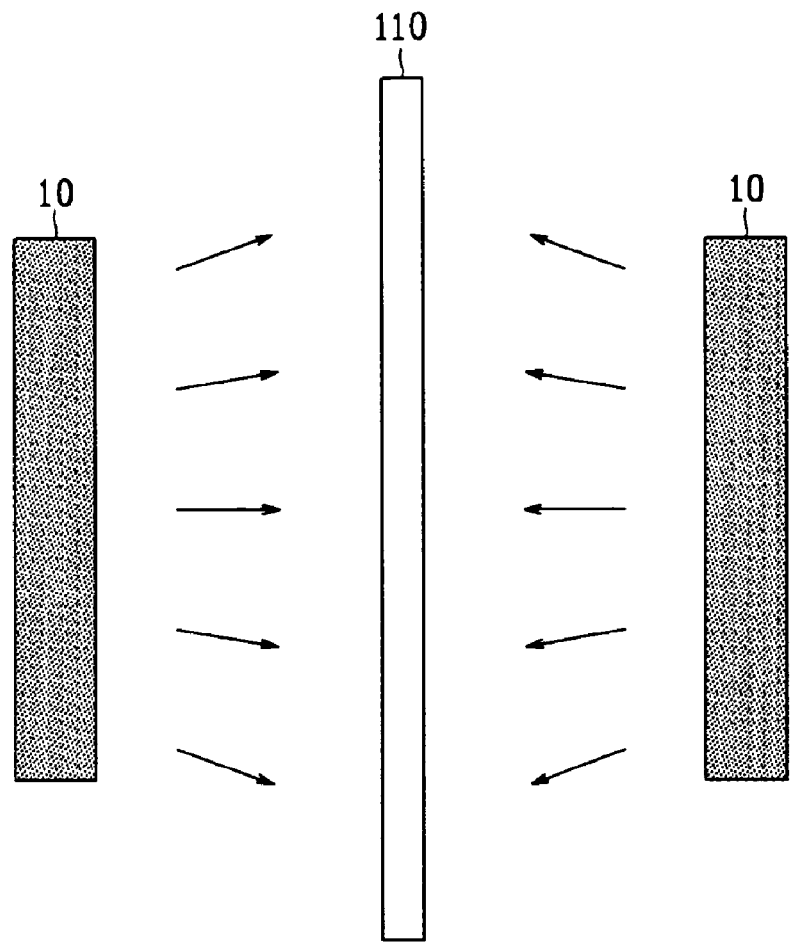
FIGS. 7A to 7F are cross-sectional views illustrating a method of manufacturing a display panel for a flexible display device according to an exemplary embodiment of the present invention.

Referring to FIG. 7A, a flexible substrate 110 is fixed within a sputtering chamber, and a protection layer 110a is deposited on both opposing surfaces of the substrate 110 by simultaneously sputtering targets 10 that are disposed on respective sides of the substrate 110. In accordance with the embodiments of the present invention, substrate 110 may be made of a flexible material, such as a plastic. The protection layer 110a generally minimizes oxygen or water from passing from the external environment through to a TFT formed on the surface of substrate 110, thereby protecting a performance of the later-formed TFT. Advantageously, a suitable exemplary protection layer 110a may include, without limitation, silicon oxide ($SiO_2$) or silicon nitride ($SiNO_x$).

Desirably, sputtering is performed at a temperature of between about 80° C. to about 150° C. On one hand, if the sputtering temperature is too low, for example below about 80° C., it may be difficult to perform sputtering. On the other hand, if the sputtering temperature is too high, for example, above about 150° C., the substrate 110 may become deformed, such as by becoming bent or by expanding. Furthermore, it is desirable that the sputtering be performed in a sputtering chamber, which may be evacuated to between about $1 \times 10^{-6}$ Torr to about $9 \times 10^{-6}$ Torr.

After depositing the protection layer 110a on the flexible substrate 110, it may be desirable to attach the flexible substrate 110 to a support body (not shown) before performing the following processes including forming the thin film. The support body can be, for example, a glass substrate.

Figure 7B:
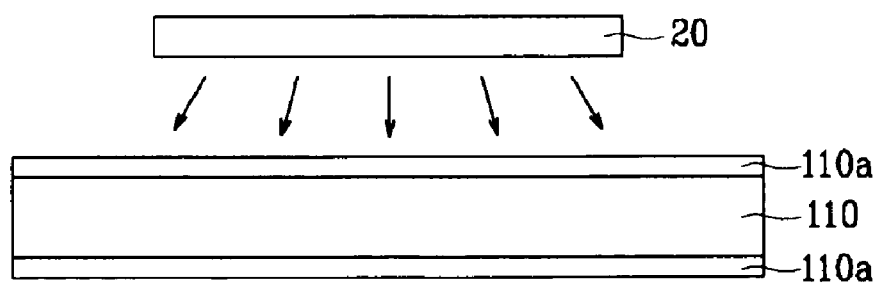
Figure 7C:
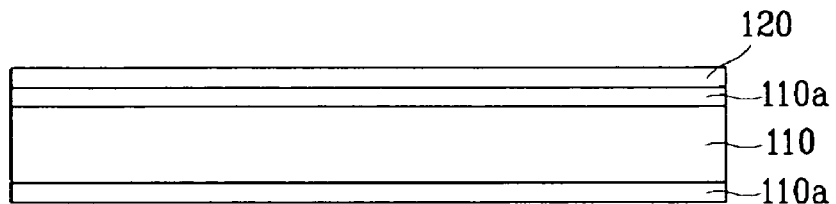

Next, as shown in FIG. 7B, substrate 110 can be exposed to a metal target 20 during a sputtering process, and the metal target 20 facilitates the formation on the substrate 110 of a metal layer 120, as shown in FIG. 7C. Desirably, the metal target 20 is sputtered at a temperature of between about 80° C. to about 150° C. in a sputtering chamber, which may be evacuated to between about $1 \times 10^{-6}$ Torr to about $9 \times 10^{-6}$ Torr of vacuum.

Figure 7D:
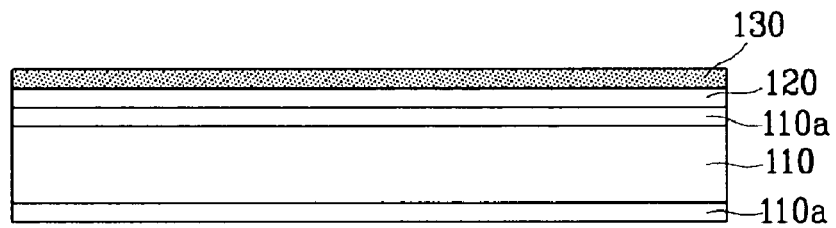

Referring to FIG. 7D, a photosensitive film 130 is laminated on substrate 110. Film 130 may have been previously manufactured in a film format, and it may be convenient to apply film 120 to substrate 110 using a method of applying a pressure to film 120 while two rollers disposed above and below the substrate rotate in opposite directions. Photosensitive film 130 may be placed on the metal layer 120.

Figure 7E:
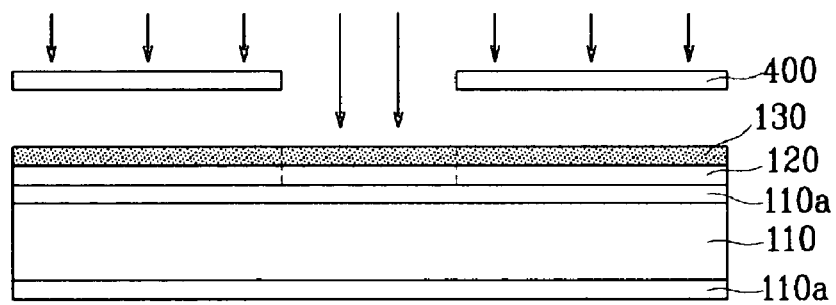

Next, referring to FIG. 7E, a desired photosensitive film pattern is formed by exposing the photosensitive film 130 using the mask 400, and by developing the exposed photosensitive film 130.

Figure 7F:
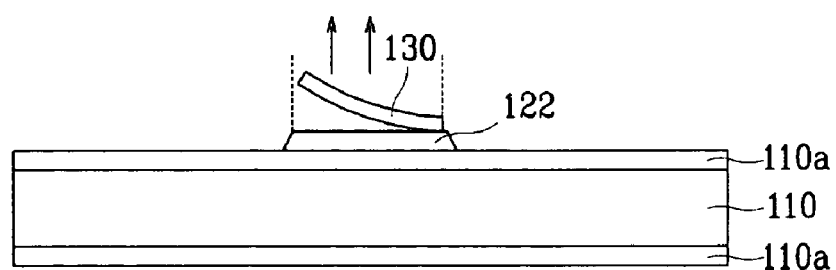

Finally, as shown in FIG. 7F, by using a photosensitive film pattern as an etching blocking layer, the metal layer 120 is etched thereby forming a metal film pattern 122, and the remaining photosensitive film 130 then is removed.

Although the photosensitive film 130 can be in the form of a laminated film, a liquid photosensitive material also may be used.

The method for forming metal film pattern 122, illustrated with respect to FIGS. 7A to 7F, may be used to form the gate lines 121 and the storage electrode lines 131. In addition to gate lines 121 and storage electrode lines 131, the gate electrodes 124, the gate line end parts 129, and the storage electrodes 133a and 133b may be formed in this manner.

Figure 8:
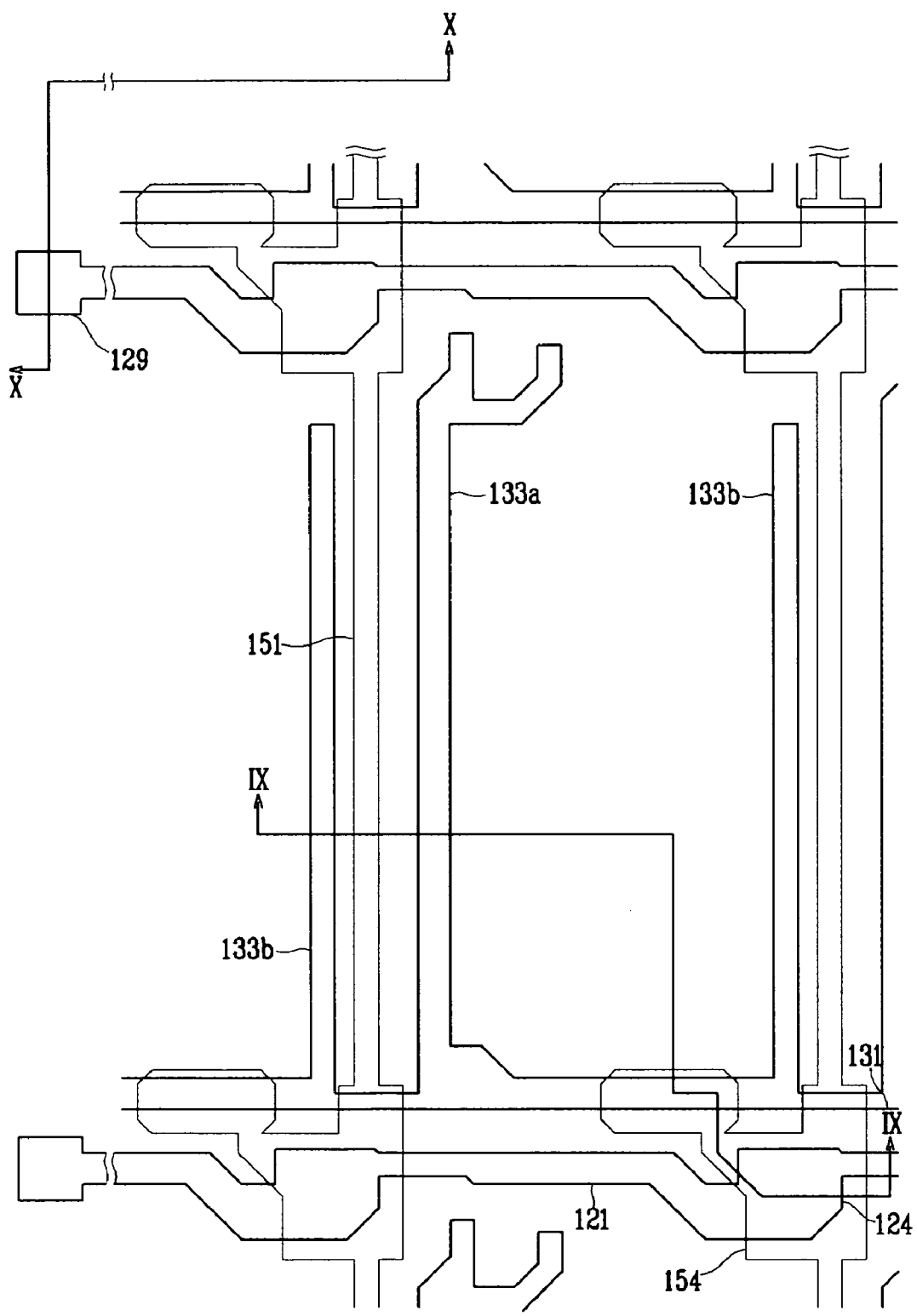
FIGS. 8, 11, and 14 are layout views sequentially illustrating a method of manufacturing a thin film transistor array panel for a liquid crystal display according to an exemplary embodiment of the present invention.
Figure 9:
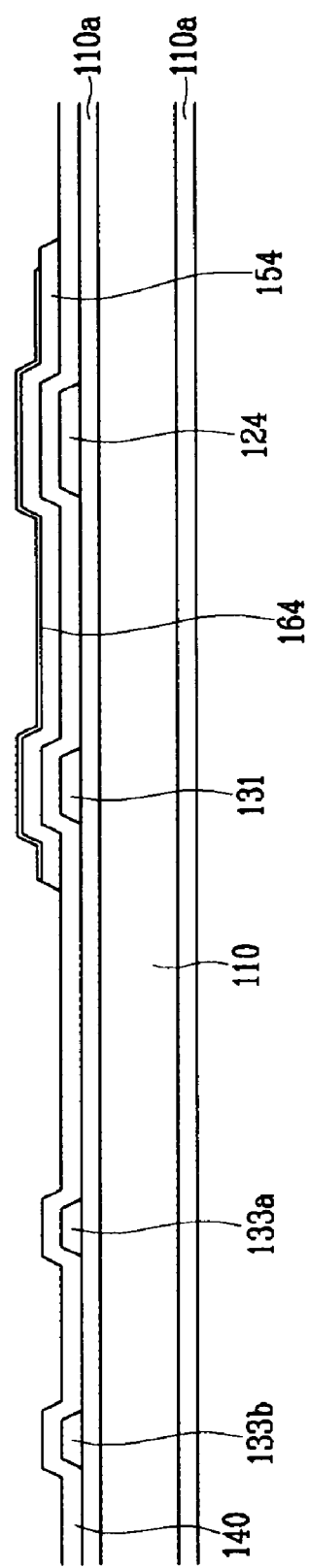
FIGS. 9 and 10 are cross-sectional views of the thin film transistor array panel taken along lines IX-IX and X-X of FIG. 8.
Figure 10:
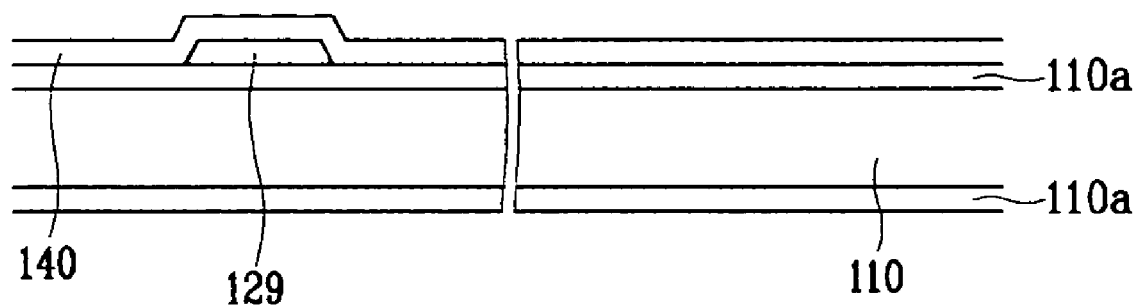

FIGS. 8 to 10 illustrate depositing the gate insulating layer 140 on substrate 110, and forming thereon a plurality of impurity semiconductor stripes 164, as well as the intrinsic semiconductor stripes 151 that include the projections 154. The gate insulating layer 140 is deposited by sputtering the target at a temperature of between about 80° C. to about 150° C. in a sputtering chamber, which may be evacuated to between about $1\times10^{-6}$ Torr to about $9\times10^{-6}$ Torr of vacuum. Intrinsic semiconductor stripes 151 and impurity semiconductor stripes 164 may be deposited on layer 140 also by sputtering at a temperature of between about 80° C. to about 150° C., in a sputtering chamber which may be evacuated to between about $1\times10^{-6}$ Torr to about $9\times10^{-6}$ Torr of vacuum. Thereafter, as shown in FIGS. 7D to 7F, after the photosensitive film 130 is laminated on the substrate 110 in which a thin film is formed, the intrinsic semiconductor stripes 151 and the impurity semiconductor stripes 164 are formed through a photolithography process.

Figure 11:
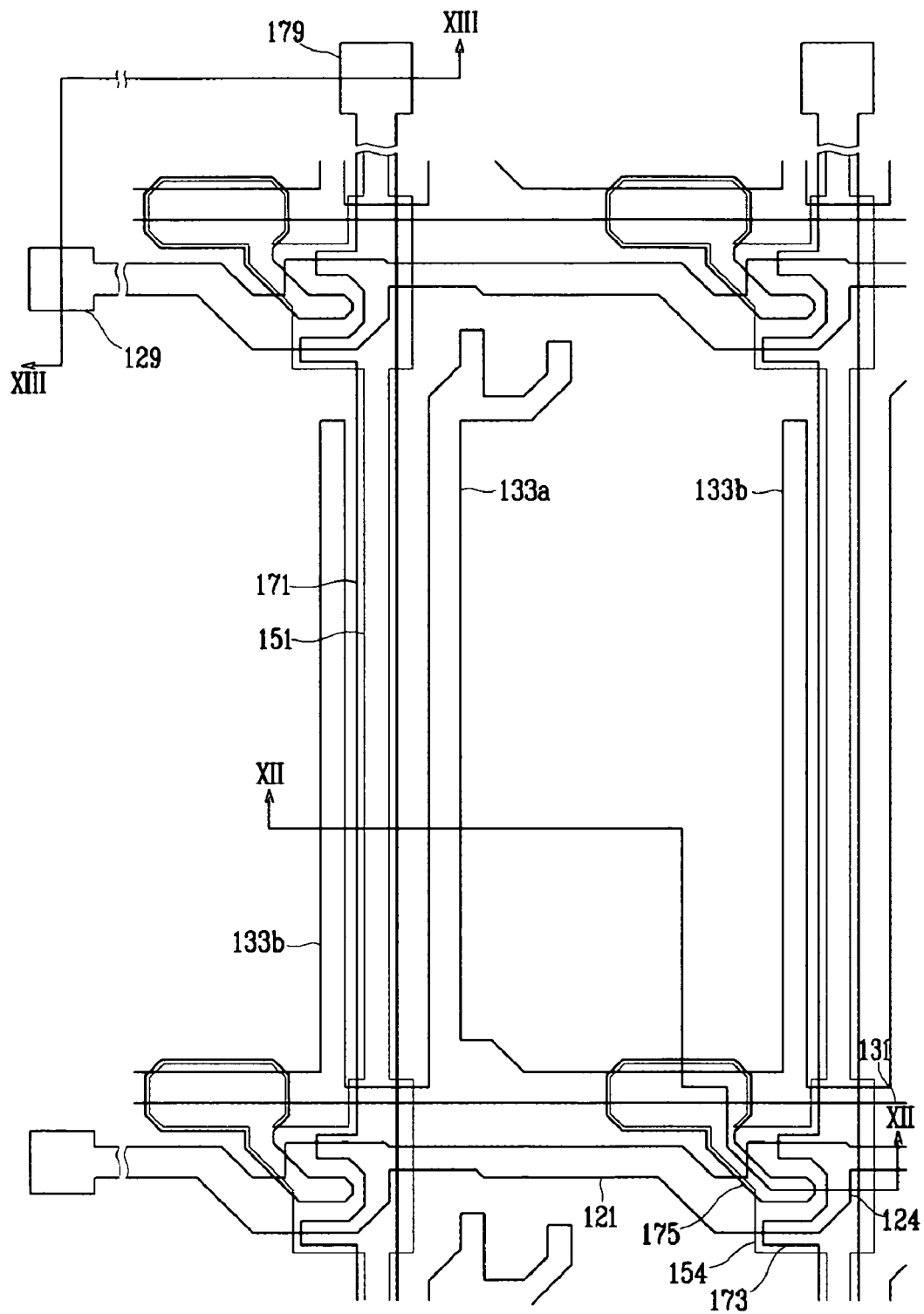
Figure 12:
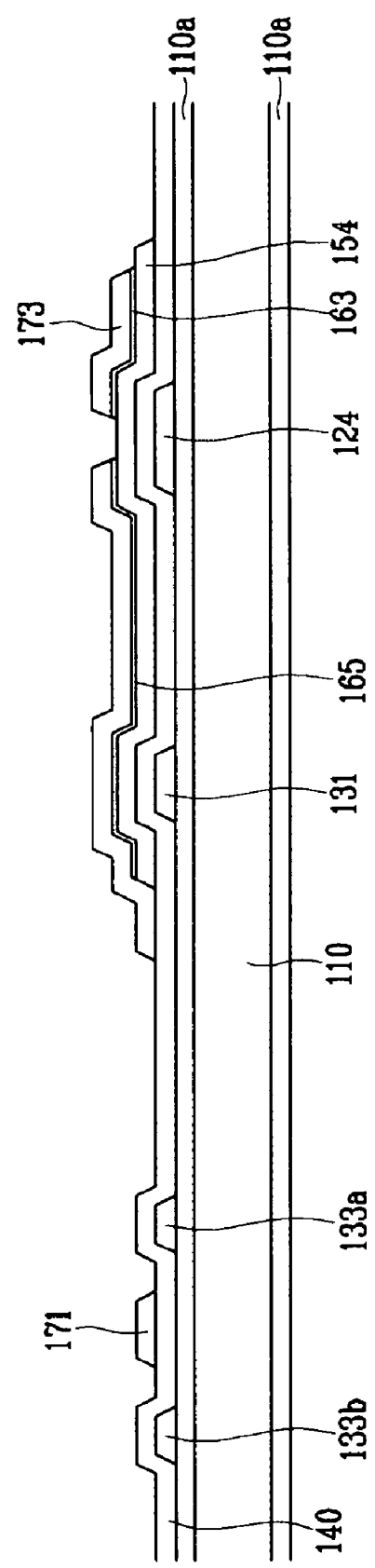
FIGS. 12 and 13 are cross-sectional views of the thin film transistor array panel taken along lines XII-XII and XIII-XIII of FIG. 11.
Figure 13:
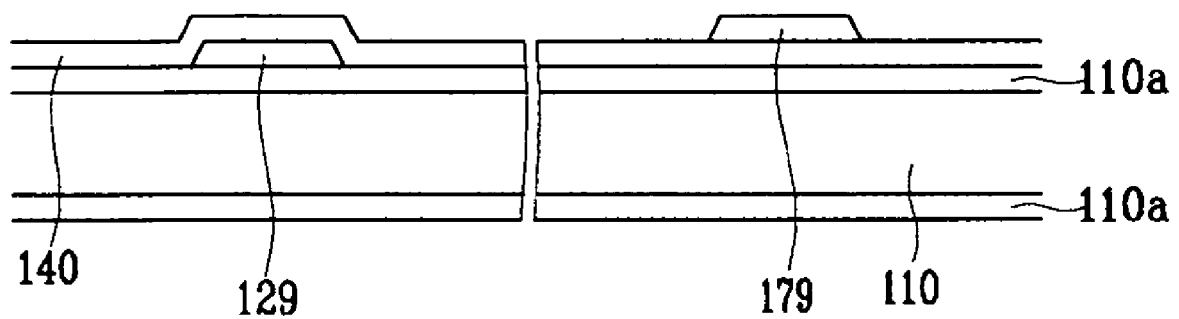

Referring to FIGS. 11 to 13, a plurality of drain electrodes 175 and a plurality of data lines 171 are formed. The source electrodes 173 and the end parts 179 can be formed along with data lines 171. Each data line 171 and drain electrode 175 are formed by depositing a thin film through sputtering a target at a temperature of between about 80° C. to about 150° C., in a sputtering chamber, which may be evacuated to between about $1\times10^{-6}$ Torr to about $9\times10^{-6}$ Torr of vacuum. After laminating and attaching the photosensitive film 130, the gate line 121 and the storage electrode line 131 may be formed using a photolithography process.

Next, it is desirable to remove the parts of the impurity semiconductor stripes 164 that are not covered with the data lines 171 and the drain electrodes 175, thereby exposing a part of the lower intrinsic semiconductors 154, and completing the plurality of ohmic contact islands 165 and the plurality of ohmic contact stripes 161, including the projections 163.

Figure 14:
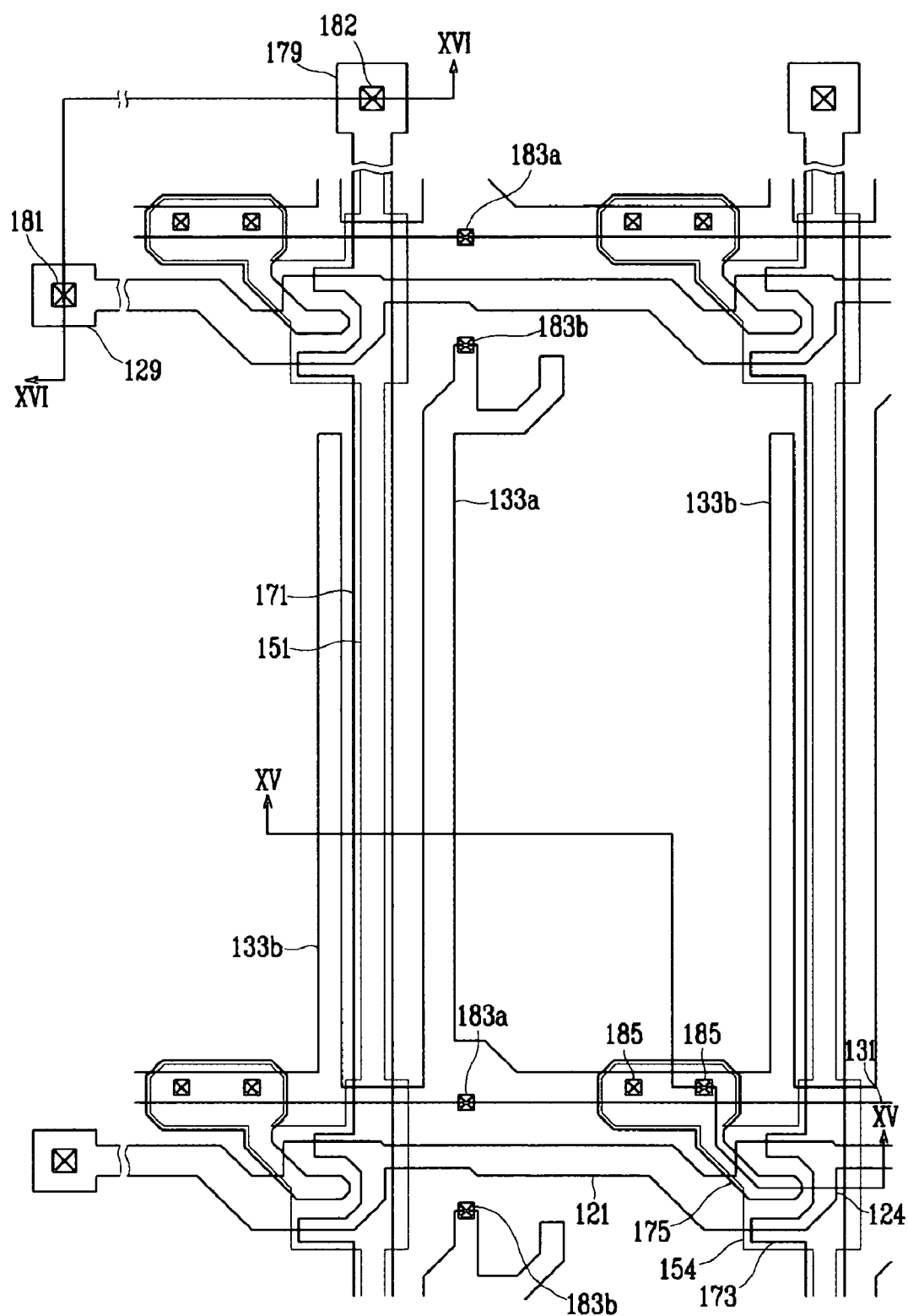
Figure 15:
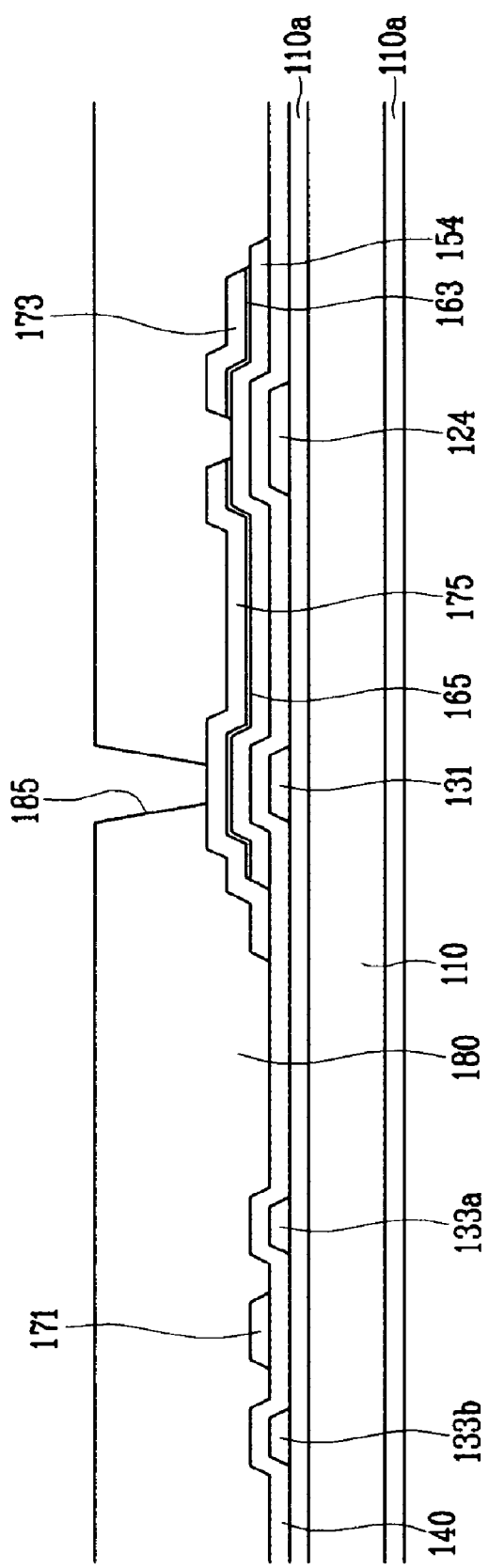
FIGS. 15 and 16 are cross-sectional views of the thin film transistor array panel taken along lines XV-XV and XVI-XVI of FIG. 14.
Figure 16:
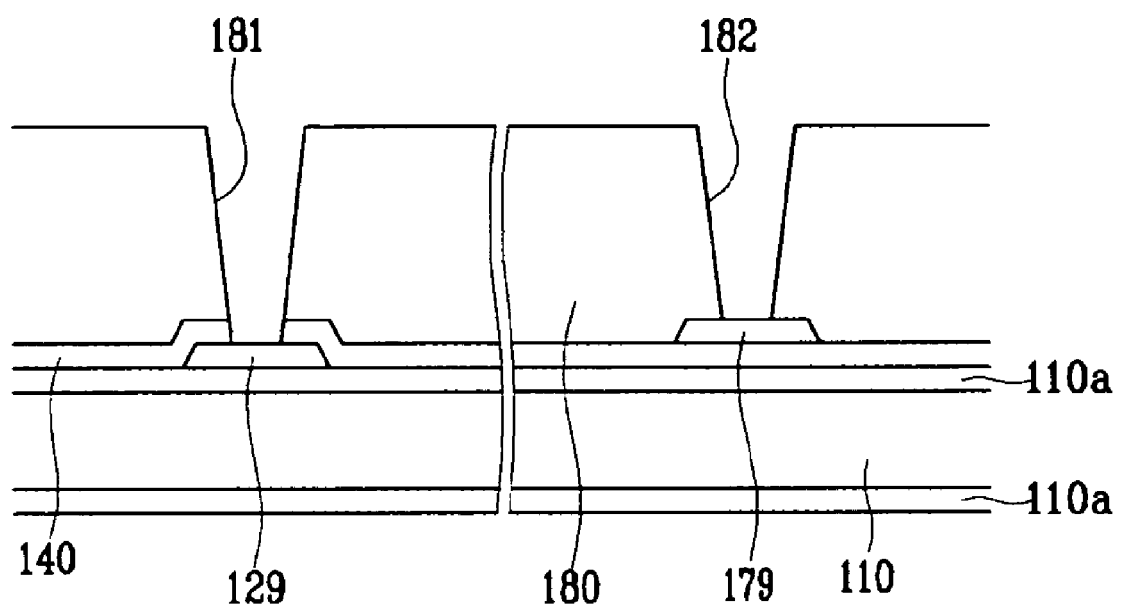

As shown in FIGS. 14 to 16, the passivation layer 180 is deposited, and then the passivation layer 180 and the gate insulating layer 140 are patterned to form a plurality of contact holes 181, 182, 183a, 183b, and 185. Contact holes 181 are formed to expose the end part 129 of the gate line 121. Contact holes 182 are formed to expose the end part 179 of the data line 171. Contact holes 183a are formed to expose a part of the storage electrode line 131 around a fixed end of the first storage electrode 133a. Contact holes 183b are formed to expose a part of a protrusion of a free end of the first storage electrode 133a. Contact holes 185 are formed to expose the drain electrode 175. The passivation layer 180 can be deposited by sputtering a target at a temperature of between about 80° C. to about 150° C., in a sputtering chamber, which may be evacuated to between about $1\times10^{-6}$ Torr to about $9\times10^{-6}$ Torr of vacuum. The photosensitive film 130 is laminated on the substrate 110 where the passivation layer 180 is formed and, afterwards, contact holes 181, 182, 183a, 183b, and 185 are formed through a photolithography process.

Finally, as shown in FIGS. 1 to 3, a plurality of pixel electrodes 191, a plurality of contact assistants 81 and 82, and a plurality of overpasses 83 are formed on the passivation layer 180, by depositing a transparent conductive layer of ITO or IZO using a sputtering process at a temperature of between about 80° C. to about 150° C., in a sputtering chamber, which may be evacuated to between about $1\times10^{-6}$ Torr to about $9\times10^{-6}$ Torr of vacuum, and then by performing a photolithography process after laminating and attaching the photosensitive film 130 on the transparent conductive layer.

Although all of the foregoing exemplary embodiments of thin film deposition processes, used to form an exemplary thin film transistor array panel, are described using a selected sputtering process at a predetermined temperature and at a predetermined degree of evacuation, such a selected sputtering process may be used in only one thin film deposition process, yet may be within the scope of the present invention. Similarly, it is not required that photosensitive film 130 be used in all of the photolithography processes employed to form a thin film transistor array panel, in accordance with embodiments of the present invention.

As described herein, embodiments of the present invention encompass a multilayered thin film structure, for example, a double-layer structure, or a triple-layer structure. Although selected ones of the thin film layers of a multilayered thin film structure may be formed using a selected sputtering process, selected others of the thin film layers of a multilayered thin film structure may be formed, for example, by laminating a photosensitive film on the substrate 110 and by patterning the photosensitive film through a photolithography process.

Figure 17:
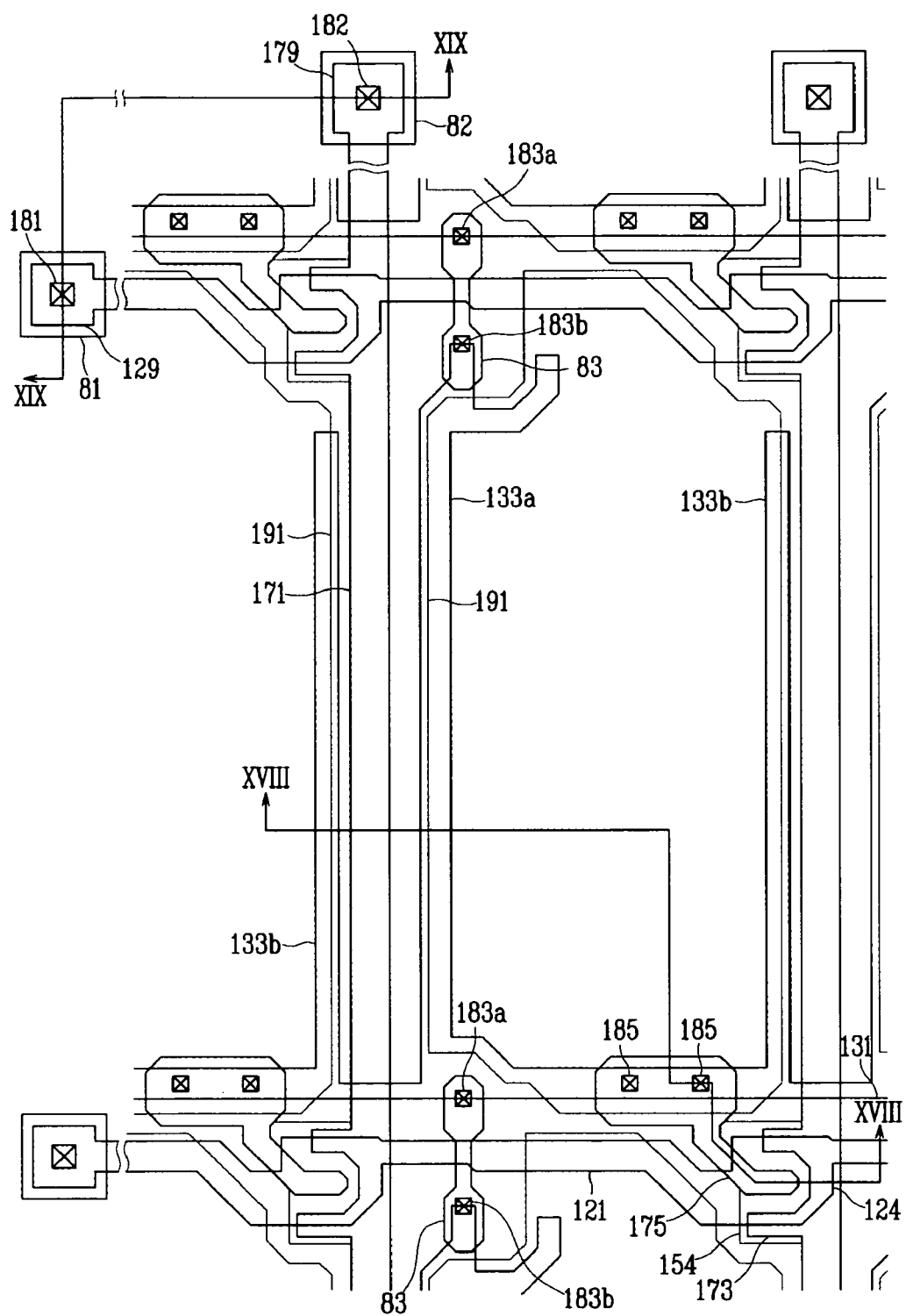
FIG. 17 is a layout view of a thin film transistor array panel for a liquid crystal display according to another exemplary embodiment of the present invention.
Figure 18:
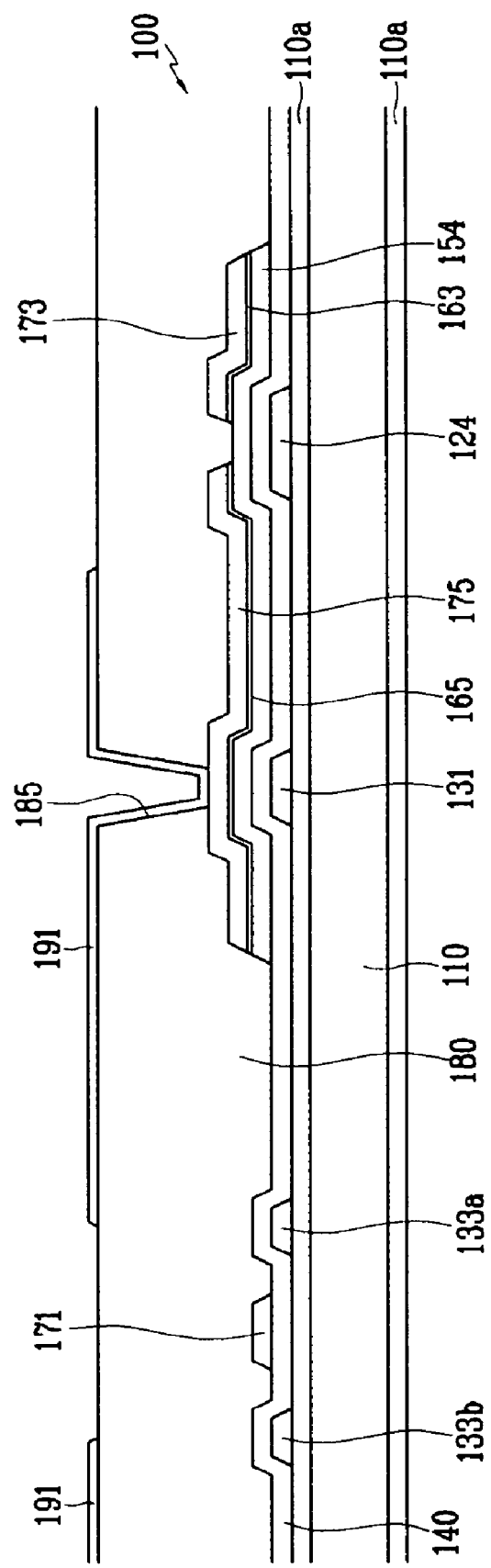
FIGS. 18 and 19 are cross-sectional views of the thin film transistor array panel taken along lines XVIII-XVIII and XIX-XIX of FIG. 17.
Figure 19:
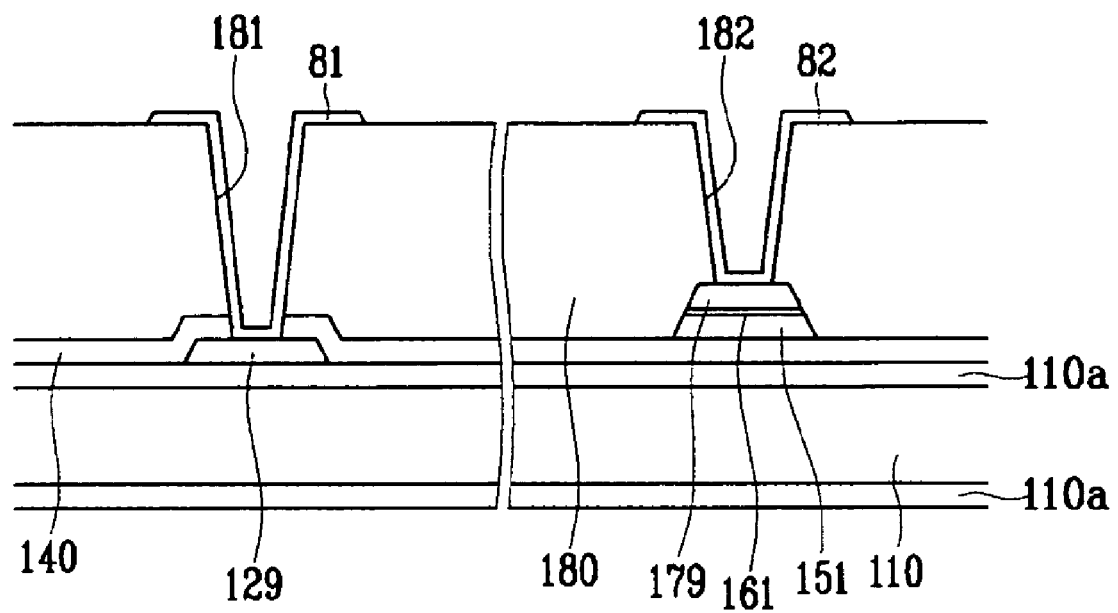
Figure 20:
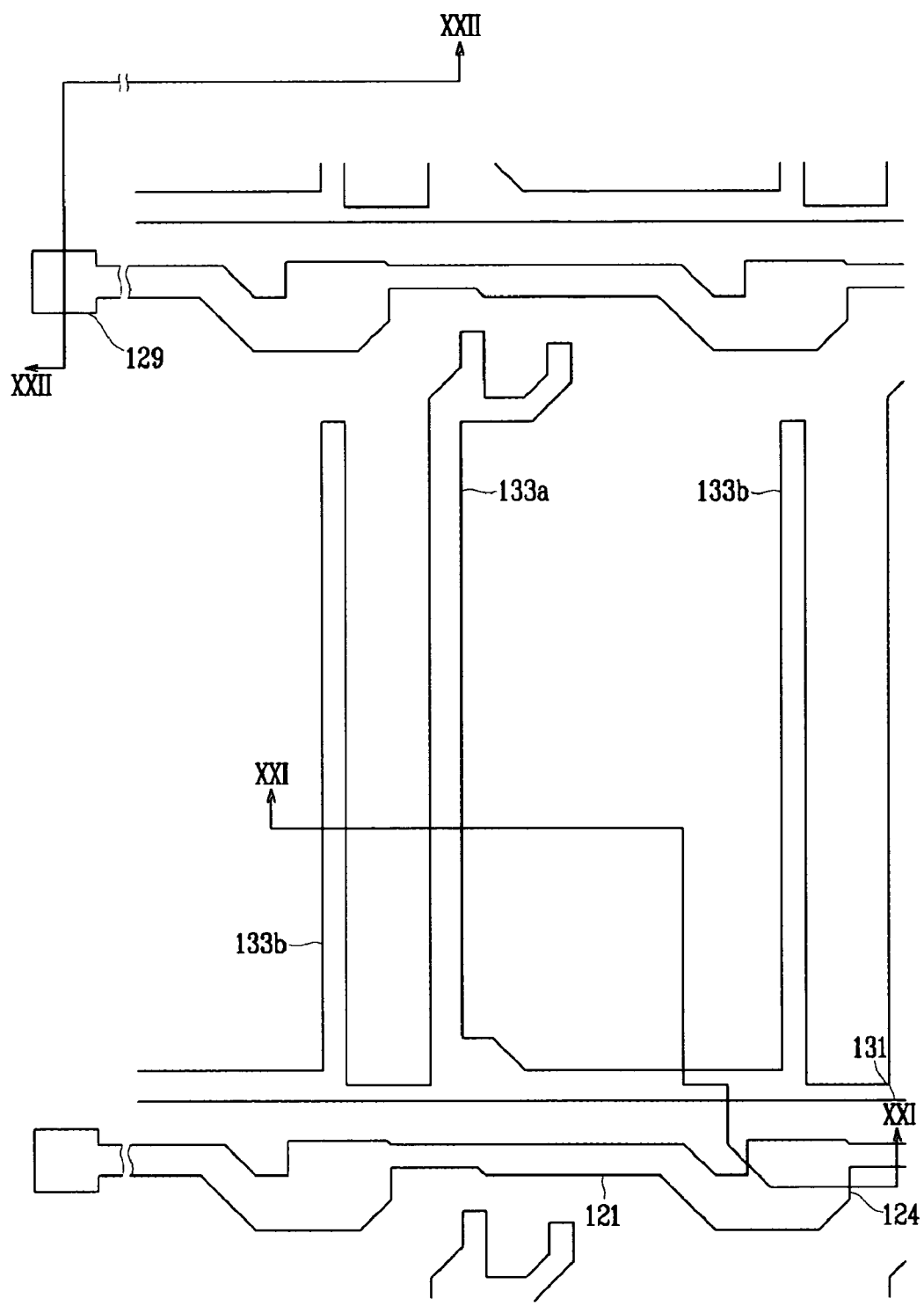
FIGS. 20, 23, and 26 are layout views sequentially illustrating a method of manufacturing a thin film transistor array panel for a liquid crystal display according to another exemplary embodiment of the present invention.
Figure 21:
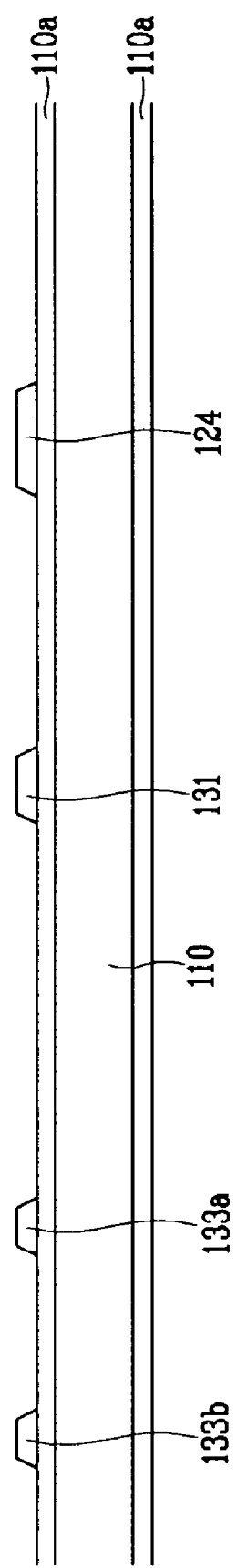
FIGS. 21 and 22 are cross-sectional views of the thin film transistor array panel taken along lines XXI-XXI and XXII-XXII of FIG. 20.
Figure 22:
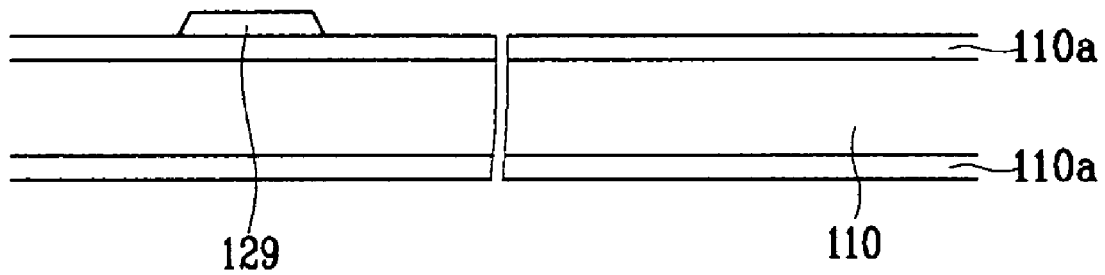
Figure 23:
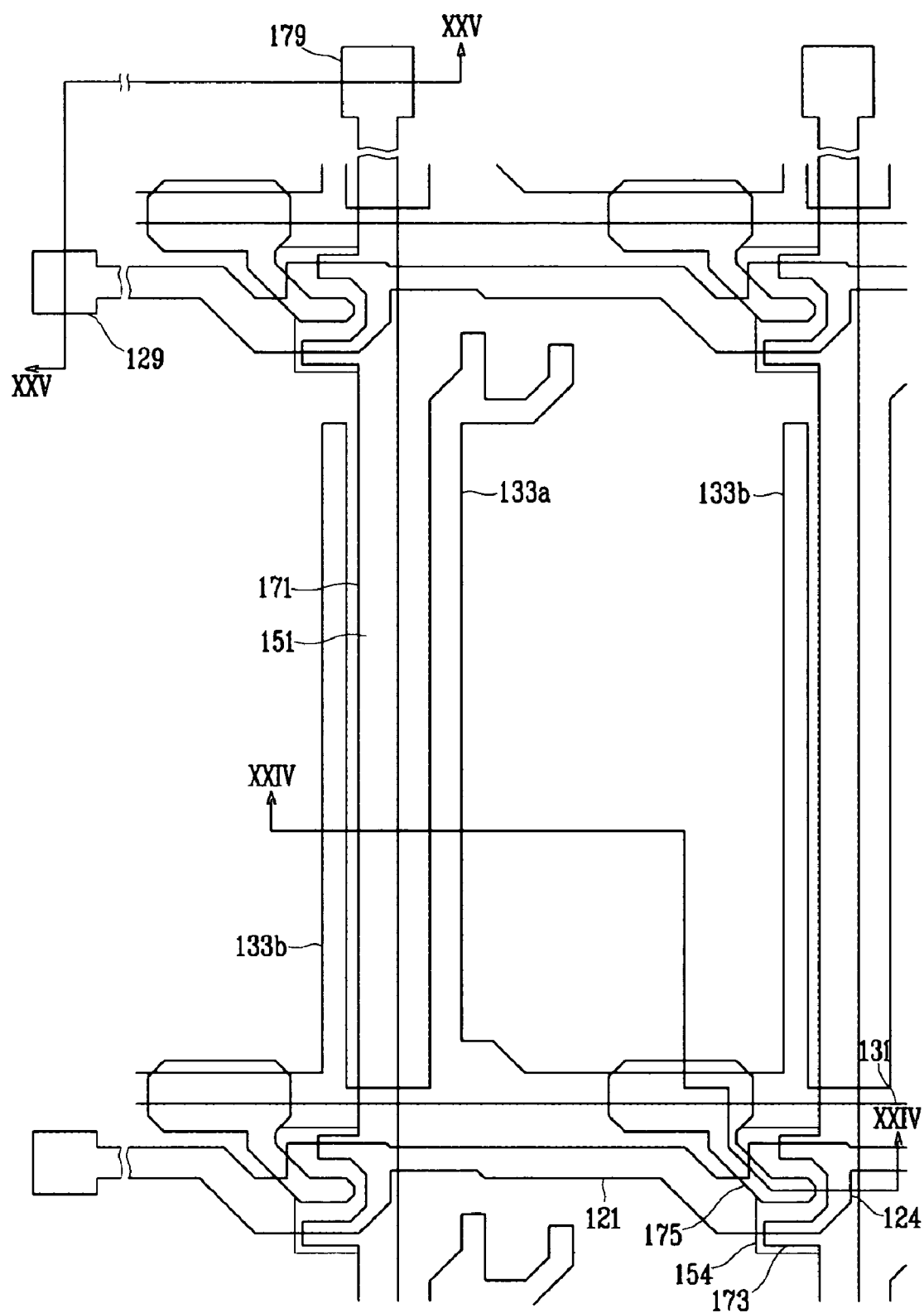
Figure 24:
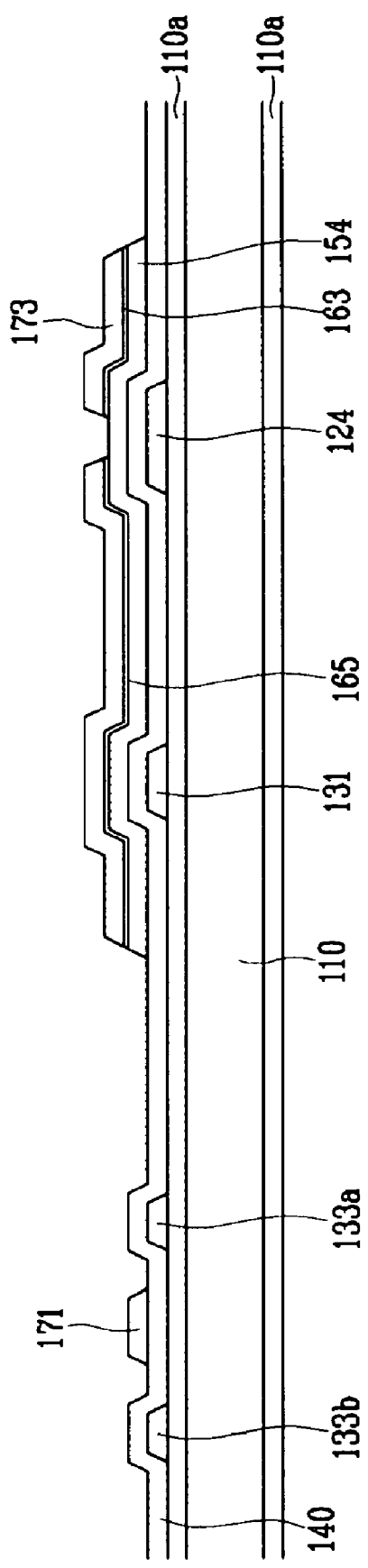
FIGS. 24 and 25 are cross-sectional views of the thin film transistor array panel taken along lines XXIV-XXIV and XXV-XXV of FIG. 23.
Figure 25:
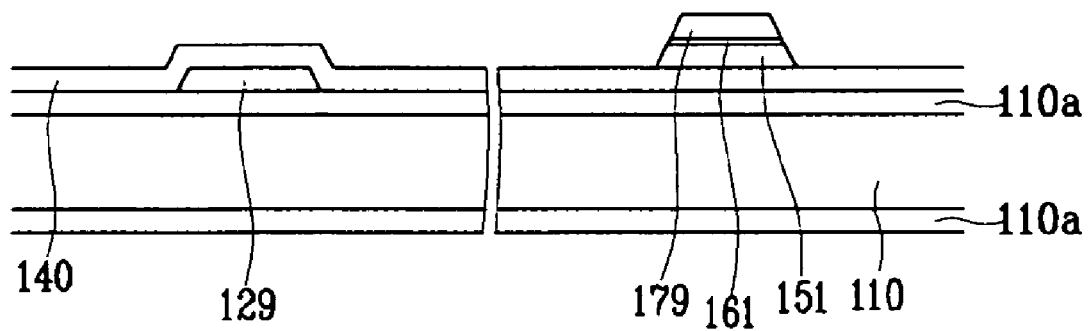
Figure 26:
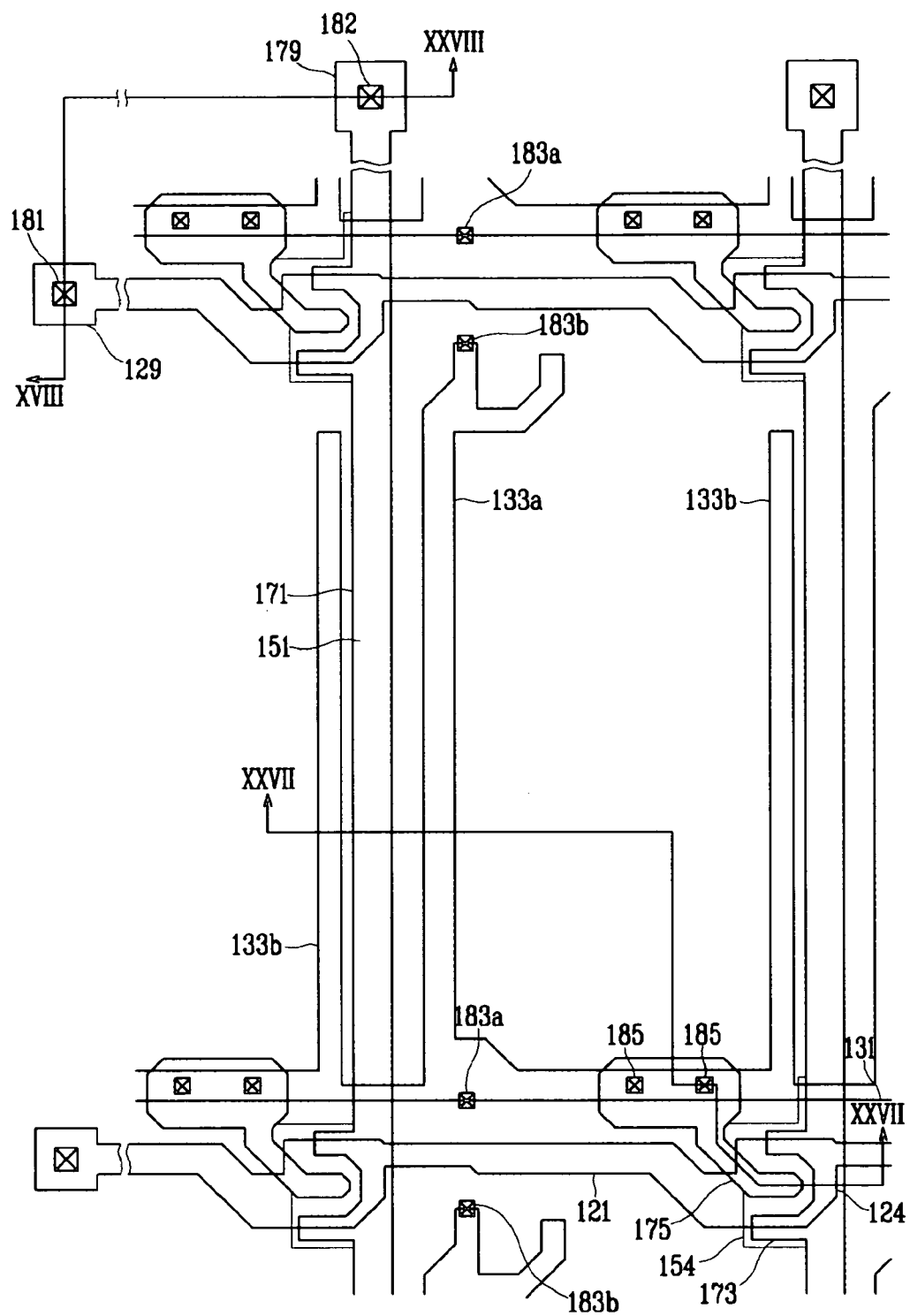
Figure 27:
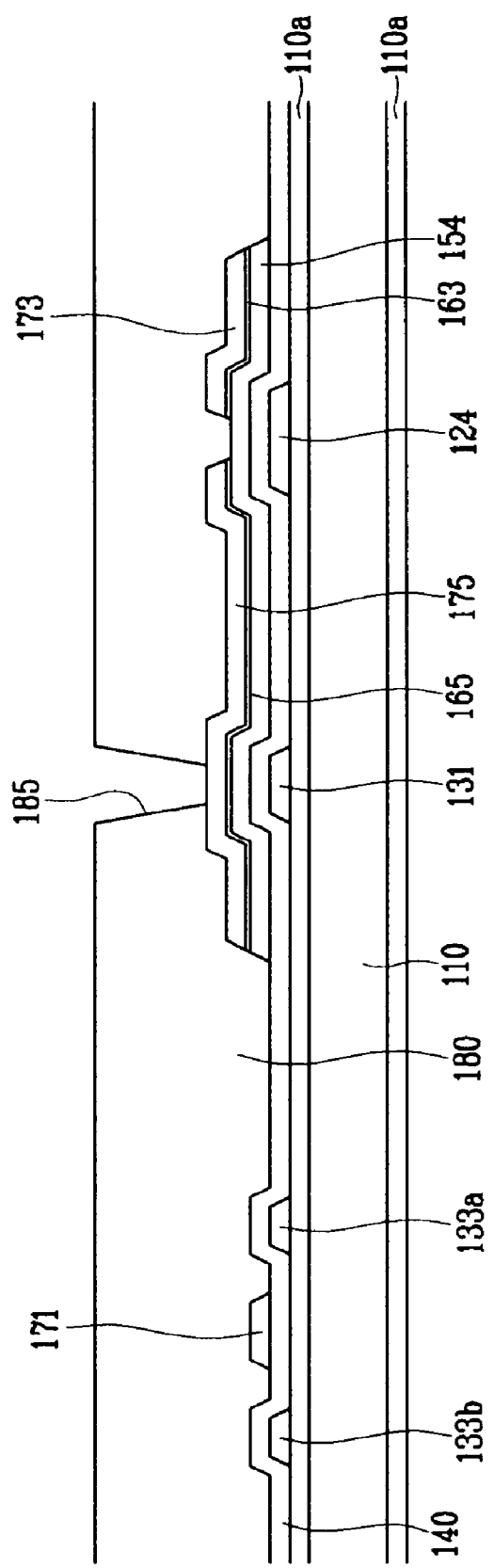
FIGS. 27 and 28 are cross-sectional views of the thin film transistor array panel taken along lines XXVII-XXVII and XXVIII-XXVIII of FIG. 26.
Figure 28:
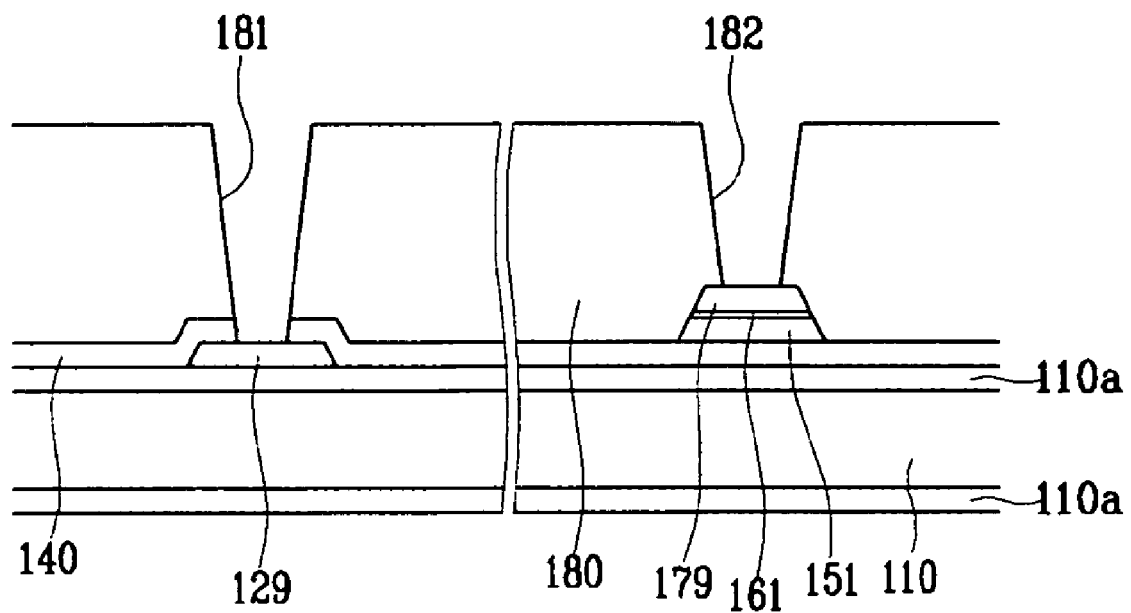

Next, a method of manufacturing a thin film transistor array panel for a liquid crystal display according to another exemplary embodiment of the present invention will be described with reference to FIGS. 17 to 28. FIG. 17 is a layout view of a thin film transistor array panel for a liquid crystal display according to another exemplary embodiment of the present invention. FIGS. 18 and 19 are cross-sectional views of the thin film transistor array panel taken along lines XVIII-XVIII and XIX-XIX of FIG. 17. FIGS. 20, 23, and 26 are layout views sequentially illustrating a method of manufacturing a thin film transistor array panel for a liquid crystal display according to another exemplary embodiment of the present invention. FIGS. 21 and 22 are cross-sectional views of the thin film transistor array panel taken along lines XXI-XXI and XXII-XXII of FIG. 20, FIGS. 24 and 25 are cross-sectional views of the thin film transistor array panel taken along lines XXIV-XXIV and XXV-XXV of FIG. 23, and FIGS. 27 and 28 are cross-sectional views of the thin film transistor array panel taken along lines XXVII-XXVII and XXVIII-XXVIII of FIG. 26.

As shown in FIGS. 17 to 19, a layered structure of a thin film transistor array panel according to the present embodiment is to the same as that shown in FIGS. 1 to 3. A plurality of gate lines 121 and a plurality of sustain electrode lines 131 are formed on the substrate 110 in a manner similar to foregoing embodiments. Each gate line 121 includes a plurality of gate electrodes 124 and an end part 129. Each storage electrode line 131 includes a plurality of storage electrodes 133a and 133b. On the gate line 121 and the storage electrode line 131 are sequentially formed the gate insulating layer 140; a plurality of semiconductor stripes 151, including the projections 154; a plurality of ohmic contact stripes 161; and a plurality of ohmic contact islands 165, including the projections 163.

On the ohmic contacts 161 and 165 are formed a plurality of drain electrodes 175 and a plurality of data lines 171, including source electrodes 173 and end parts 179 with a passivation layer 180 being formed thereon. Similar to foregoing exemplary embodiments, a plurality of contact holes 181, 182, 183a, 183b, and 185 are formed on the passivation layer 180 and the gate insulating layer 140. Also, a plurality of pixel electrodes 191, a plurality of overpasses 83, and a plurality of contact assistants 81 and 82, are formed on the passivation layer 180.

However, unlike the liquid crystal display shown in FIGS. 1 to 4, the semiconductor stripes 151 can have substantially the same plane shape as the data lines 171, the drain electrodes 175, and the lower ohmic contacts 161 and 165. However, each semiconductor stripe 151 has a portion between the source electrode 173 and the drain electrode 175 and a portion that is exposed without being covered by the data line 171 and the drain electrode 175.

A method of manufacturing a thin film transistor array panel for a liquid crystal display according to an exemplary embodiment will be described within the context of FIGS. 7A, 20, 21, and 22.

First, as in FIG. 7A, a protection layer 110a is deposited on two opposing surfaces of the flexible substrate 110 by sputtering a target at a temperature of between about 80° C. to about 150° C., in a sputtering chamber, which may be evacuated to between about $1\times10^{-6}$ Torr to about $9\times10^{-6}$ Torr of vacuum.

Referring to FIGS. 20 to 22, the gate lines 121 and electrode lines 131 are formed on the flexible substrate 110. The gate lines 121 include the gate electrodes 124 and the end parts 129. The storage electrode lines 131 include the storage electrodes 133a and 133b. At this time, a conductive layer is also deposited by sputtering the target at a temperature of between about 80° C. to about 150° C., in a sputtering chamber, which may be evacuated to between about 1×10–6 Torr to about 9×10–6 Torr of vacuum. As shown in FIGS. 7D to 7F, after the photosensitive film 130 is laminated on the substrate 110, a conductive layer is formed, with the gate lines 121 and the storage electrode lines 131 being patterned in the conductive layer through a photolithography process.

Next, referring to FIGS. 23 to 25, the gate insulating layer 140 is deposited using a selected sputtering process by sputtering a suitable insulating material such as, for example, silicon nitride (SiNx), at a temperature of between about 80° C. to about 150° C., in a sputtering chamber, which may be evacuated to between about $1\times10^{-6}$ Torr to about $9\times10^{-6}$ Torr of vacuum. Thereafter, each of intrinsic semiconductor layer and the impurity semiconductor layer is deposited using the foregoing selected sputtering process, as is a consecutively-deposited data metal layer.

Thereafter, the data lines 171, the drain electrodes 175, the semiconductor layers 151, and the ohmic contacts layers 161 and 165 are formed by a single photolithography process. A photosensitive film, used in this photolithography process step, can have different thicknesses, depending on its position on the TFT. The photosensitive film can include a first part having a first thickness and a second part having a second thickness, where the first thickness is greater than the second thickness. Desirably, the first part having the first thickness generally is positioned in a wiring region in which the data lines 171 and the drain electrodes 175 are positioned. Similarly, it is desirable to position the second part having the second thickness in a channel region area of the TFT.

One known method by which the thickness of a photosensitive film may be changed selectively, depending on a position of the film include, for example, a method of providing a translucent area in a photomask, in addition to a light transmitting area and a light blocking area. Another known method for selectively varying the thickness of a photosensitive film, can include using a thin film that has a light-transmitting pattern, such as a slit pattern or a lattice pattern; using a thin film having a region in which transmittance is moderate; and using a thin film providing a moderate thickness in a translucent area. Desirably, when a slit pattern is used, a width of the slits or a space between the slits is smaller than the resolution of the light exposer used in the photolithography process. Another example of a known method by which the thickness of a photosensitive film may be changed selectively includes a method of using a photosensitive film that can reflow. That is, after a reflowable photosensitive film is formed to a first thickness with a normal exposure mask that uses only a light transmitting area and a light blocking area, a thin part having a second thickness is formed by reflowing the photosensitive film, and by allowing the photosensitive film to flow into an area in which the photosensitive film generally does not remain.

Advantageously, a data metal layer that is exposed in the remaining part can be removed with etching by using the first part of the photosensitive film. Similarly, an amorphous silicon layer and an intrinsic semiconductor layer doped with impurities, which may remain using the first part of the photosensitive film etches can be dry-etched. Next, the second part of the photosensitive film that exists in the channel part is removed. At this time, a thickness in the first part of the photosensitive film also becomes somewhat thin. Thereafter, a data metal pattern is divided into the source electrode 173 and the drain electrode 175 by using the first part that is removed to etch the second part of the photosensitive film. After exposing a pattern in a channel region between the source electrode 173 and the drain electrode 175 on the amorphous silicon doped with an impurity, an intrinsic semiconductor part 154 is exposed by etching the doped amorphous silicon pattern that is positioned in a channel region using the first part of the photosensitive film as an etching mask.

Next, referring to FIGS. 26 to 28, the passivation layer 180 is deposited, and then the passivation layer 180 and the gate insulating layer 140 are patterned to form a plurality of contact holes 181, 182, 183a, 183b, and 185. Contact holes 181 are formed to expose the end part 129 of the gate line 121. Contact holes 182 are formed to expose the end part 179 of the data line 171. Contact holes 183a are formed to expose a part of the storage electrode line 131 around a fixed end of the first storage electrode 133a. Contact holes 183b are formed to expose a part of a protrusion of a free end of the first storage electrode 133a. Contact holes 185 are formed to expose the drain electrode 175. The passivation layer 180 can be deposited by sputtering a target at a temperature of between about 80° C. to about 150° C., in a sputtering chamber, which may be evacuated to between about $1\times10^{-6}$ Torr to about $9\times10^{-6}$ Torr of vacuum. The photosensitive film 130 is laminated on the substrate 110 in which the passivation layer 180 is formed and, thereafter, contact holes 181, 182, 183a, 183b, and 185, are formed through a photolithography process.

Finally, as shown in FIGS. 1 to 3, a plurality of pixel electrodes 191, a plurality of contact assistants 81 and 82, and a plurality of overpasses 83 are formed on the passivation layer 180. The pixel electrodes 191, the plurality of contact assistants 81 and 82, and the plurality of overpasses 83 are formed by forming a transparent conductive layer through sputtering at a temperature of between about 80° C. to about 150° C., in a sputtering chamber, which may be evacuated to between about $1\times10^{-6}$ Torr to about $9\times10^{-6}$ Torr of vacuum, and by performing a photolithography process after laminating and attaching the photosensitive film 130 on the transparent conductive layer.

Only a thin film transistor array panel is described in the present exemplary embodiment, but selected embodiments of the present invention can be used to manufacture other display panels for which a thin film formed by methods described herein may be suitable, including, without limitation, a display panel that is disposed opposite to a thin film transistor array panel in a liquid crystal display, and a display panel for an OLED display.

In this way, an accurate thin film pattern can be formed on a flexible substrate, which may become bent or expanded by the heat produced during existing thin-film formation processes, by employing a selected sputtering process in which a thin film is deposited on the flexible substrate, at a temperature generally lower than existing thin film formation processes.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a display panel for a liquid crystal display, comprising:
   mounting a flexible substrate in a sputtering chamber;
   forming a gate line on the flexible substrate;
   depositing a gate insulating layer on the flexible substrate;
   forming a semiconductor layer on the gate insulating layer;
   forming a data line and a drain electrode on the semiconductor layer;
   forming a passivation layer on the data line and the drain electrode; and
   forming a pixel electrode that is electrically connected to the drain electrode, wherein at least one of the depositing of the gate insulating layer, the forming of the semiconductor layer, and the forming of the passivation layer comprises sputtering a target at a temperature of between about 80° C. to about 150° C. and wherein the sputtering target is disposed on opposing sides of the flexible substrate.

2. The method of claim 1, wherein at least one of the forming of the gate line, the forming of the semiconductor layer, the forming of the data line and the drain electrode, and the forming of the pixel electrode comprises:
   depositing a thin film;
   laminating a photosensitive film by pressure on the thin film; and
   patterning the thin film with a photolithography process.

3. The method of claim 1, wherein the sputtering is performed in the sputtering chamber evacuated to between about $1\times10^{-6}$ Torr to about $9\times10^{-6}$ Torr of vacuum.

4. The method of claim 1, further comprising simultaneously forming protection layers on opposing surfaces of the flexible substrate by sputtering two targets disposed opposite each other with respect to the flexible substrate.

5. A method of manufacturing a display panel for a liquid crystal display, comprising:
   preparing a flexible substrate;
   forming a gate line on the flexible substrate;
   depositing a gate insulating layer on the flexible substrate;
   forming a semiconductor layer on the gate insulating layer;
   forming a data line and a drain electrode on the semiconductor layer;
   forming a passivation layer on the data line and the drain electrode; and
   forming a pixel electrode that is electrically connected to the drain electrode;
   wherein each of the forming of the gate line, the depositing of the gate insulating layer, the forming of the semiconductor layer, the forming of the drain electrode and the data line including a source electrode, the forming of the passivation layer, and the forming of the pixel electrode comprises sputtering at a temperature of between about 80° C. to about 150° C., and wherein a sputtering target is disposed on opposing sides of the flexible substrate.

6. The method of claim 5, wherein the preparing a flexible substrate includes:
   mounting the flexible substrate in a sputtering chamber; and
   depositing a protection layer on opposing surfaces of the substrate with a selected sputtering process, wherein the protection layer is simultaneously sputtered from two targets that are disposed on opposing sides of the substrate.

7. The method of claim 6, wherein the sputtering is performed in the sputtering chamber evacuated to between about $1\times10^{-6}$ Torr to about $9\times10^{-6}$ Torr of vacuum.

8. The method of claim 6, wherein the sputtering is performed in the sputtering chamber evacuated to between about $1\times10^{-6}$ Torr to about $9\times10^{-6}$ Torr of vacuum.

9. The method of claim 5, wherein at least one of the forming of a gate line, the forming of a semiconductor layer, the forming of a drain electrode and a data line including a source electrode, and the forming of a pixel electrode comprises laminating a photosensitive film on a target layer that is deposited with a selected sputtering process and patterning the photosensitive film with photolithography.

10. A method of manufacturing a display panel for a liquid crystal display, comprising:
    preparing a flexible substrate;
    forming a gate line comprising a gate electrode on the flexible substrate;
    depositing a gate insulating layer on the gate line and the flexible substrate;
    depositing a semiconductor layer and an ohmic contact layer on the gate insulating layer;
    depositing a conductive layer on the ohmic contact layer;
    forming a photosensitive film pattern including first and second portions having different thicknesses on the conductive layer;
    etching the conductive layer, the ohmic contact layer, and the semiconductor layer using the first and second portions of the photosensitive film pattern as an etching mask;
    ashing the photosensitive film pattern to remove the second portion of the photosensitive film pattern and to expose a portion of the conductive layer corresponding to the second portion of the photosensitive film pattern;
    etching the exposed portion of the conductive layer and a portion of the ohmic contact layer disposed under the exposed portion of the conductive layer using the remaining first portion of the photosensitive film pattern as an etching mask; and
    forming a pixel electrode on the conductive layer,
    wherein each of the forming of the gate line, the depositing of the gate insulating layer, the depositing of the semiconductor layer and the ohmic contact layer, the depositing of the conductive layer, and the forming of a pixel electrode comprises sputtering at a temperature of between about 80° C. to about 150° C.

11. The method of claim 10, wherein the preparing of a flexible substrate includes:
    mounting the flexible substrate in a sputtering chamber; and
    depositing a protection layer on opposing surfaces of the flexible substrate with a selected sputtering process,
    wherein the protection layer is simultaneously sputtered from two targets that are disposed on opposing sides of the flexible substrate.

12. The method of claim 11, wherein the sputtering is performed in the sputtering chamber evacuated to between about $1\times10^{-6}$ Torr to about $9\times10^{-6}$ Torr of vacuum.

13. The method of claim 10, wherein the sputtering is performed in the sputtering chamber evacuated to between about $1\times10^{-6}$ Torr to about $9\times10^{-6}$ Torr of vacuum.

14. The method of claim 5, wherein the semiconductor layer comprises amorphous silicon or polysilicon.

15. The method of claim 10, wherein forming a photoresist film pattern on the conductive layer comprises forming a photosensitive film over the conductive layer, the photosensitive film comprising a first part having a first thickness and a second part having a second thickness, and further wherein the first part of the photosensitive film is disposed over a wiring region and the second part of the photosensitive film is disposed over a channel region and the second thickness is smaller than the first thickness.

16. The method of claim 10, wherein the semiconductor layer comprises amorphous silicon or polysilicon.

* * * * *